United States Patent
Fukuda et al.

(10) Patent No.: US 8,487,713 B2
(45) Date of Patent: Jul. 16, 2013

(54) MULTIBAND MATCHING CIRCUIT AND MULTIBAND POWER AMPLIFIER

(75) Inventors: Atsushi Fukuda, Yokosuka (JP); Hiroshi Okazaki, Zushi (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 829 days.

(21) Appl. No.: 12/695,442

(22) Filed: Jan. 28, 2010

(65) Prior Publication Data

US 2010/0194487 A1 Aug. 5, 2010

(30) Foreign Application Priority Data

Jan. 30, 2009 (JP) ................................. 2009-020581
Jan. 15, 2010 (JP) ................................. 2010-006885

(51) Int. Cl.
*H03H 7/38* (2006.01)

(52) U.S. Cl.
USPC ............................................. 333/32; 333/33

(58) Field of Classification Search
USPC ...................................................... 333/32, 33
See application file for complete search history.

(56) References Cited

U.S. PATENT DOCUMENTS

| | | | |
|---|---|---|---|
| 5,786,737 A | 7/1998 | Goto | |
| 6,396,348 B1 * | 5/2002 | Honjo | ........................... 330/286 |
| 2002/0118075 A1 | 8/2002 | Ohwada et al. | |
| 2006/0261911 A1 | 11/2006 | Fukuda et al. | |
| 2007/0018758 A1 | 1/2007 | Fukuda et al. | |
| 2008/0129410 A1 | 6/2008 | Fukuda et al. | |
| 2008/0150630 A1 | 6/2008 | Fukuda et al. | |
| 2008/0278260 A1 | 11/2008 | Fukuda et al. | |

FOREIGN PATENT DOCUMENTS

| | | |
|---|---|---|
| EP | 1 605 589 A1 | 12/2005 |
| EP | 1 936 814 A1 | 6/2008 |
| EP | 1 998 437 A1 | 12/2008 |
| JP | 54-29949 A | 3/1979 |
| JP | 10-242776 | 9/1998 |
| JP | 2007-150407 | 6/2007 |
| JP | 2008-160192 A | 7/2008 |
| JP | 2009-20581 | 1/2009 |
| KR | 10-2008-0058208 A | 6/2008 |

OTHER PUBLICATIONS

Office Action issued Oct. 6, 2011, in Korean Patent Application No. 10-2010-0006932 with English translation.

(Continued)

*Primary Examiner* — Stephen Jones
(74) *Attorney, Agent, or Firm* — Oblon, Spivak, McClelland, Maier & Neustadt, L.L.P.

(57) ABSTRACT

A multiband matching circuit includes a first matching unit for converting an impedance in a signal path to Z0 in a first frequency band, and a second matching unit formed of a series matching section connected at one end in series with the first matching unit in the signal path, which is a transmission line whose characteristic impedance is equal to the matching impedance Z0 or a circuit equivalent to the transmission line at least in the first frequency band, and a parallel matching section connected at one end to the signal path at the other end of the series matching section and grounded at the other end. The parallel matching section is configured to open in impedance the connection point to the signal path in the first frequency band. The series matching section and the parallel matching section are designed to match an impedance in a second frequency band with Z0.

12 Claims, 37 Drawing Sheets

OTHER PUBLICATIONS

Koji Chiba, et al., "Mobile Terminals", NTT DoCoMo Technical Journal, vol. 4, No. 1, 2002, 10 pages (With English Translation).

Atsushi Fukuda, et al., "Multi-band Power Amplifier Employing MEMS Switches for Optimum Matching", IEICE General Conference, C-2-4, 2004, 2 pages (With Partial English Translation).

Chinese Office Action issued Jul. 4, 2012 in Patent Application No. 201010108101.2 with English Translation.

Office Action issued Sep. 29, 2011, in European Patent Application No. 10 151 927.0.

Office Action issued Sep. 18, 2012 in Japanese Patent Application No. 2010-006885 with English language translation.

* cited by examiner

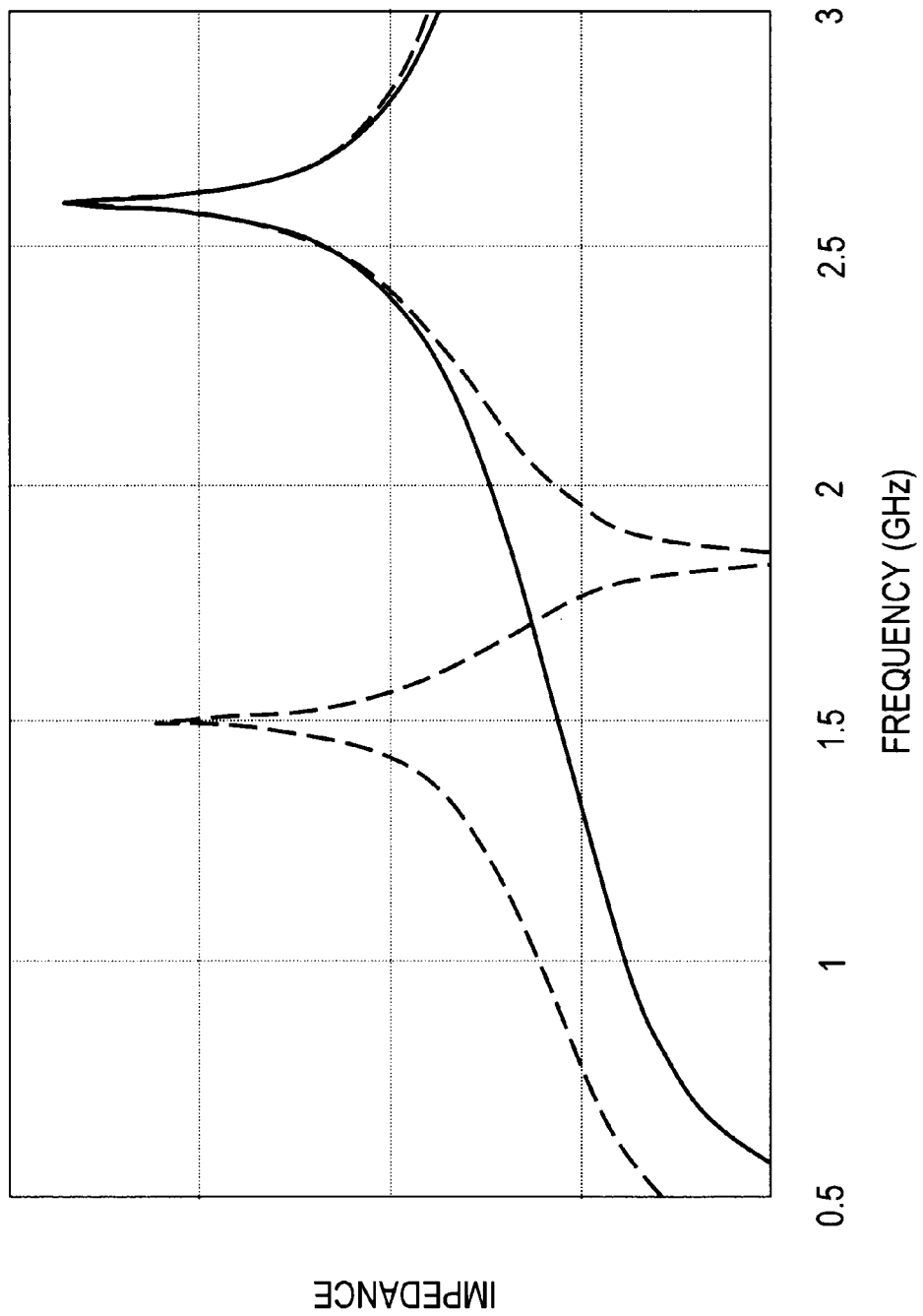

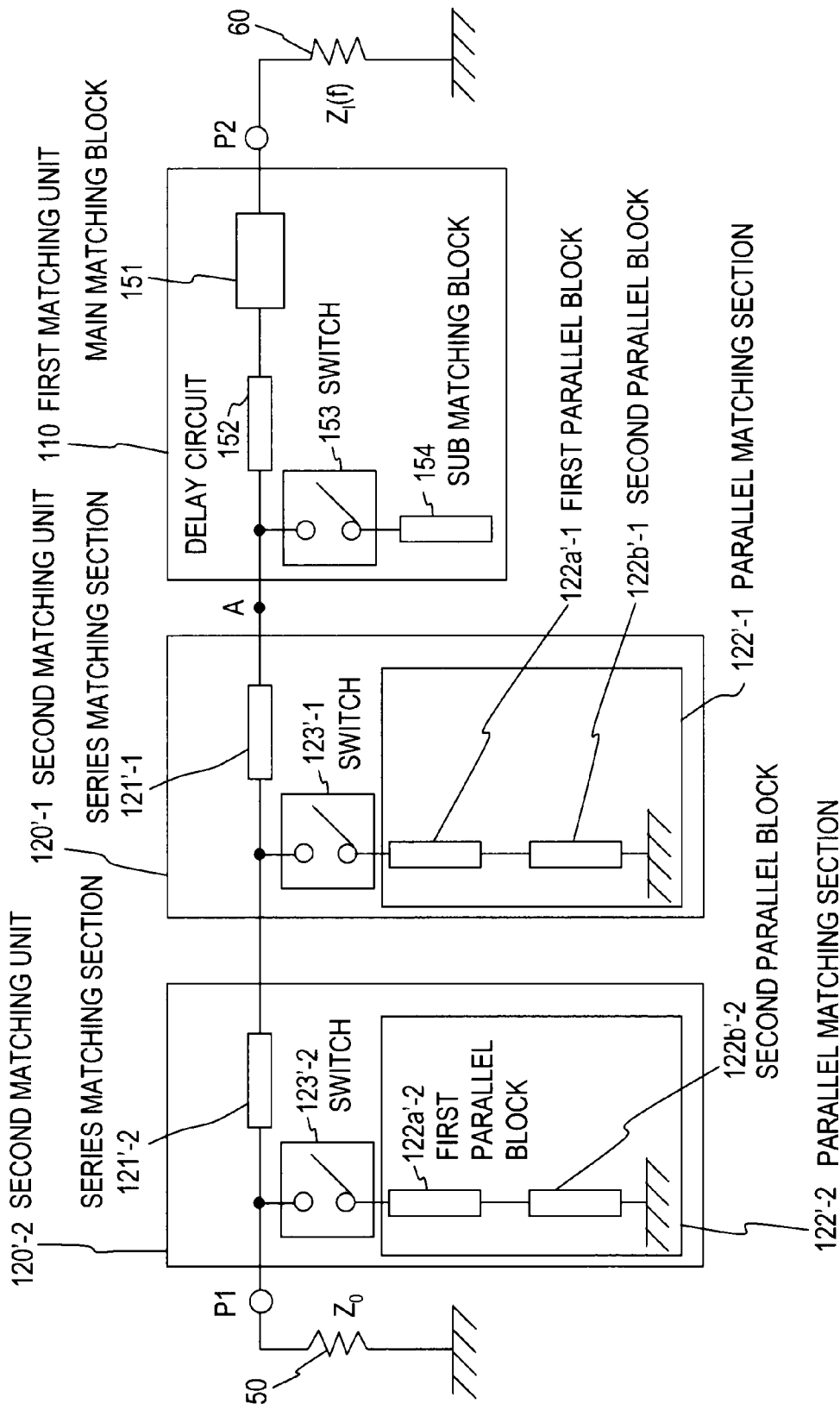

MULTIBAND MATCHING CIRCUIT AND MULTIBAND POWER AMPLIFIER

BACKGROUND OF THE INVENTION

1. Field of the Invention

The present invention relates to matching circuits to be used in amplifiers and the like and to power amplifiers. More specifically, the present invention relates to a multiband matching circuit that can establish matching between the input-output impedance of a circuit element having frequency dependence such as an amplification device and the impedance of a peripheral circuit in a plurality of frequency bands simultaneously and to a multiband power amplifier having the multiband matching circuit.

2. Description of the Related Art

As radio communication services have become more diverse in recent years, radio equipment is required to have a capability of dealing with signals in a plurality of frequency bands (multiband). In IEEE802.11/a/b/g wireless LAN standards, for example, a 5.2-GHz band and a 2.4-GHz band are specified.

Radio equipment contains a power amplifier for amplifying a signal in the radio frequency band and supplying the signal to an antenna. Since the power amplifier consumes much power, the operation efficiency should be improved. This requirement can be satisfied by providing a matching circuit optimized to improve the efficiency in the operating frequency band. A configuration that would be generally provided to optimize efficiency in two different frequency bands uses a switch for selecting a circuit optimally designed for each frequency band.

FIG. 13 shows the structure of a dual-band power amplifier 300 that can amplify signals in two frequency bands, as disclosed in Koji Chiba, et al. "Mobile Terminals," NTT DoCoMo Technical Journal, 2002, Vol. 10, No. 1, pp. 15-20, and other documents. In the structure, a 5.2-GHz amplifier 10 designed specifically for the 5.2-GHz band or a 2.4-GHz amplifier 20 designed specifically for the 2.4-GHz is selected by two single-pole double-throw (SPDT) switches 30 in accordance with the operating frequency.

Both the 5.2-GHz amplifier 10 and the 2.4-GHz amplifier 20 in the dual-band power amplifier 300 shown in FIG. 13 include an input matching circuit 41, an amplification device 60, and an output matching circuit 42, as shown in FIG. 14. The performance of the amplifier is determined by the characteristics of the amplification device and the matching circuits. In the amplifiers 10 and 20, the amplification device 60 is connected between the matching circuits 41 and 42, which are optimized to establish matching in the corresponding frequency bands. In the dual-band power amplifier 300 shown in FIG. 13, the amplifiers 10 and 20 that include the optimized matching circuits are selected by the SPDT switches 30 in accordance with the operating frequency band. If the SPDT switches have sufficiently small insertion loss, each amplifier would perform high-output, high-efficiency operation.

SUMMARY OF THE INVENTION

In a dual-band power amplifier using amplification devices whose impedance is dependent on the frequency characteristics, two amplifiers respectively provided for a first frequency band and a second frequency band are required because matching circuits provided for the frequency bands must be combined. Because many components, such as amplification devices and input-output matching circuits, are required, the size of the equipment increases and the power consumption of the whole circuit is also increased due to the power consumption of the many components. In addition, the insertion loss of the SPDT switch decreases output power and efficiency. If a mixed signal of two frequency bands has to be amplified efficiently in the two frequency bands simultaneously, a divider and a combiner are required, which increases the circuit scale further (refer to International Publication No. 01/005028 Pamphlet, for example).

An object of the present invention is to provide a matching circuit that can establish matching in a plurality of frequency bands simultaneously and, consequently, to implement a multiband power amplifier that can amplify mixed signals of a plurality of frequency bands simultaneously, without providing separate amplifiers for the corresponding frequency bands.

A multiband power amplifier according to the present invention includes an amplification device and a multiband matching circuit of the present invention.

The multiband matching circuit of the present invention includes a first matching unit and a second matching unit and is disposed on a signal path between a circuit element having an impedance $Z_1(f)$ dependent on frequency characteristics and a system circuit having a predetermined impedance Z0. The matching circuit establishes matching between the impedance $Z_1(f)$ of the circuit element and the impedance Z0 of the system circuit in the two frequency bands simultaneously.

The first matching unit is connected at one end to the circuit element and converts the impedance of the circuit element to Z0 in the first frequency band.

The second matching unit includes a series matching section connected at one end to the other end of the first matching unit and connected at the other end to the system circuit, which is a transmission line whose characteristic impedance is equal to the impedance Z0 of the system circuit or a circuit equivalent to the transmission line at least in the first frequency band, and a parallel matching section connected at one end to the signal path at the other end of the series matching section and grounded at the other end.

The parallel matching section is configured to open in impedance at the connection point to the signal path in the first frequency band. The series matching section and the parallel matching section are designed appropriately to establish matching with the impedance Z0 in the second frequency band.

EFFECTS OF THE INVENTION

The present invention makes it possible to implement a matching circuit that can establish matching in a plurality of frequency bands simultaneously, consequently implementing a multiband power amplifier that can amplify a mixed signal of a plurality of frequency bands simultaneously, without providing a plurality of amplifiers.

BRIEF DESCRIPTION OF THE DRAWINGS

FIG. 6 shows impedance versus frequency characteristics in the structure shown in FIG. 5;

FIG. 7A is a functional block diagram of a structure in which two second matching units are connected in series, the units being the same as a second matching unit in the multiband matching circuit according to the modification of the first embodiment;

DETAILED DESCRIPTION OF THE PREFERRED EMBODIMENTS

Embodiments of the present invention will be described below in detail.

First Embodiment

Figure 1:
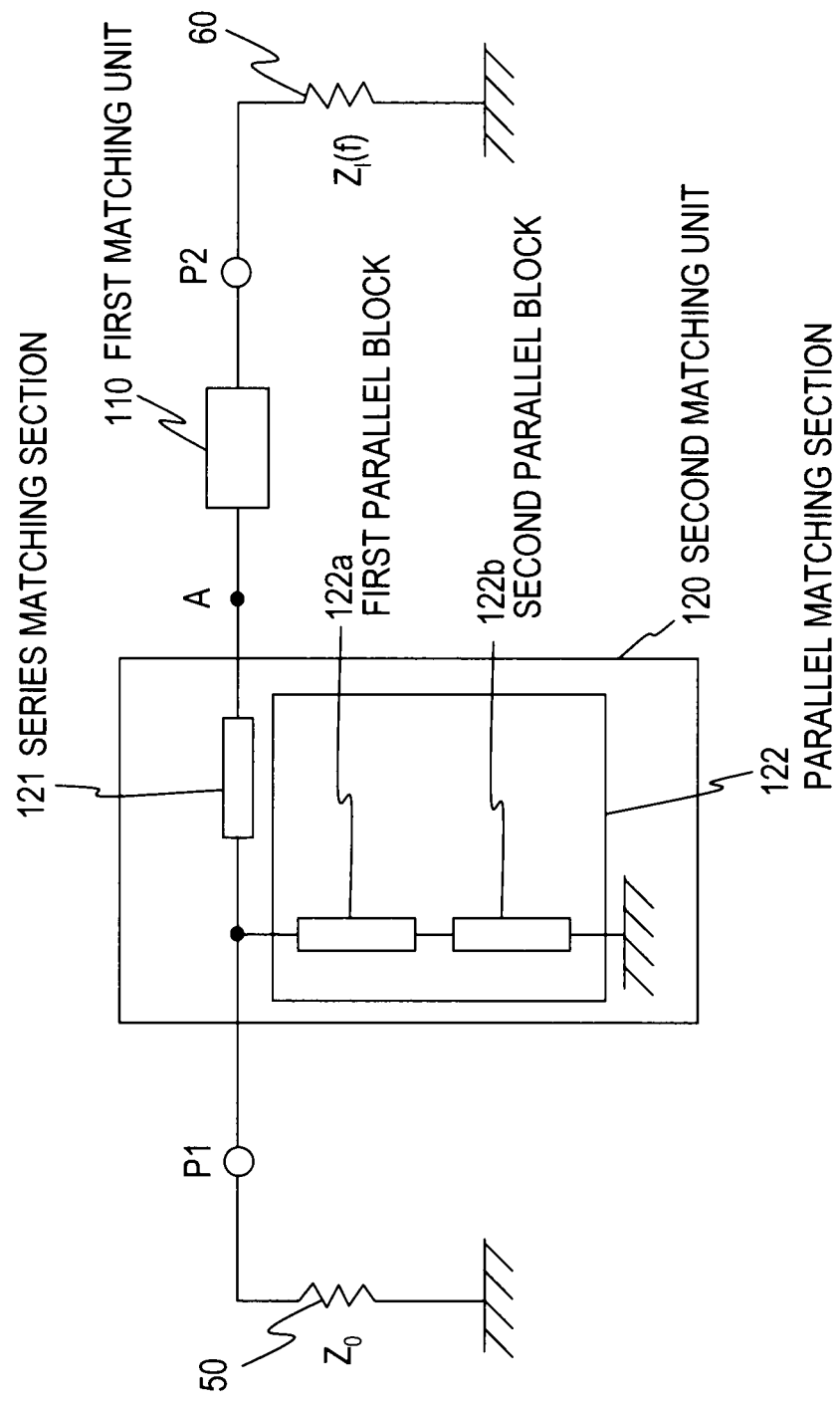
FIG. 1 is a functional block diagram of a multiband matching circuit according to a first embodiment.
Figure 2:
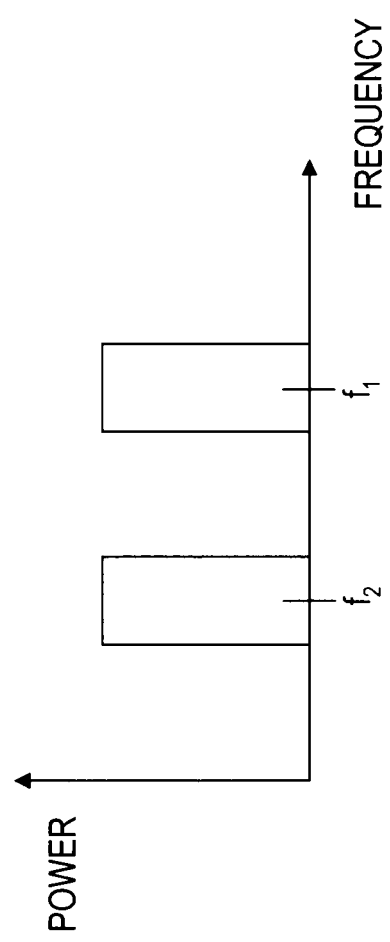
FIG. 2 is a view illustrating the relationship between two frequency bands.

FIG. 1 shows a matching circuit 100 according to a first embodiment. The matching circuit 100 handles signals in two frequency bands $b_1$ and $b_2$ having central frequencies $f_1$ and $f_2$ as shown in FIG. 2. The matching circuit 100 is placed in a signal path between an amplification device 60 having an impedance $Z_1(f)$ dependent on frequency characteristics and a system circuit 50 having a predetermined impedance Z0 (50Ω or 75Ω, for example). The matching circuit 100 matches the impedance $Z_1(f)$ of the amplification device 60 to the impedance Z0 of the system circuit 50 in $b_1$ and $b_2$.

The matching circuit 100 includes the first matching unit 110 and the second matching unit 120. The second matching unit 120 includes a series matching section 121 and a parallel matching section 122.

The first matching unit 110 has one end connected to the amplification device 60 and converts the impedance $Z_1(f_1)$ of the amplification device 60 in a first frequency band $b_1$ to Z0 when viewed from the other end (point A in FIG. 1). The first matching unit 110 can have any structure, such as a structure formed of a transmission line and a stub or a structure formed of a series inductor and a parallel capacitor. Here, the impedance $Z_1(f_2)$ of the amplification device 60 in $b_2$ is converted to $Z(f_2)$.

Figure 15A:
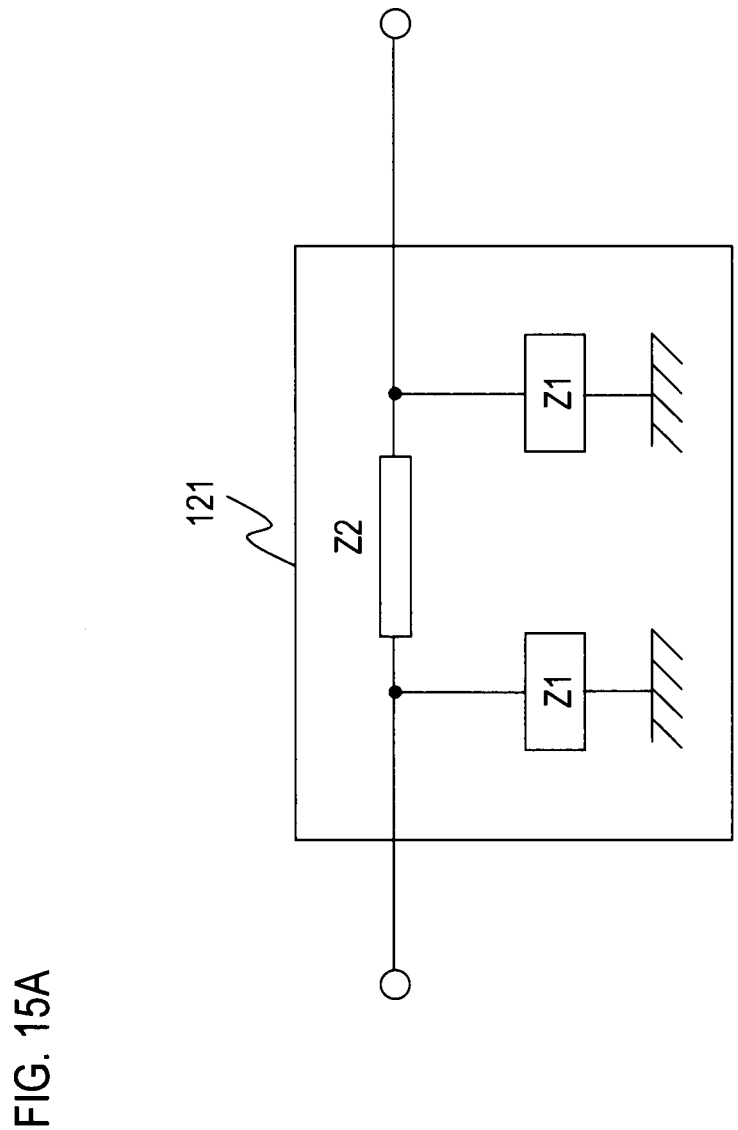
FIG. 15A shows the structure of a circuit equivalent to a transmission line whose characteristic impedance is Z0 at least in $b_1$.
Figure 16A:
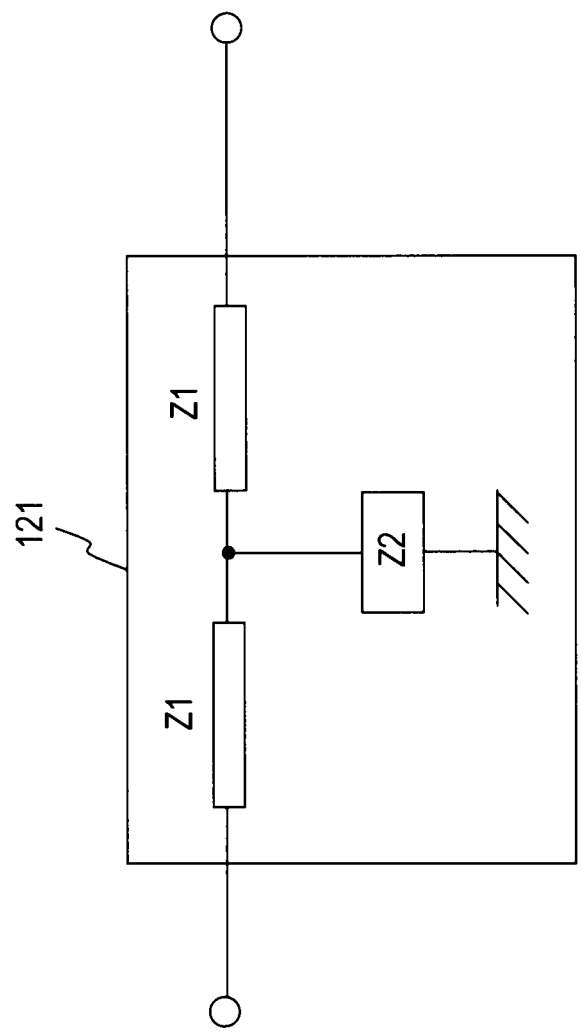
FIG. 16A shows another structure of the circuit equivalent to the transmission line whose characteristic impedance is Z0 at least in $b_1$.

The other end of the first matching unit 110 is connected to one end of the series matching section 121, and the other end of the series matching section 121 is connected to the system circuit 50. The series matching section 121 is formed of a transmission line whose characteristic impedance is Z0 or a delay circuit equivalent to the transmission line at least in $b_1$. FIGS. 15A and 16A show example structures of a circuit whose characteristic impedance is equal to Z0 at least in $b_1$.

Figure 15B:
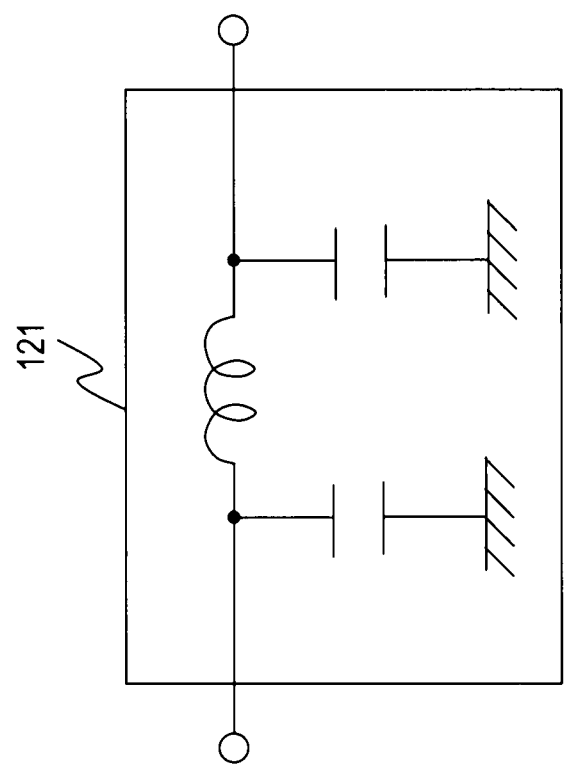
FIG. 15B shows a specific structure of that shown in FIG. 15A.
Figure 15C:
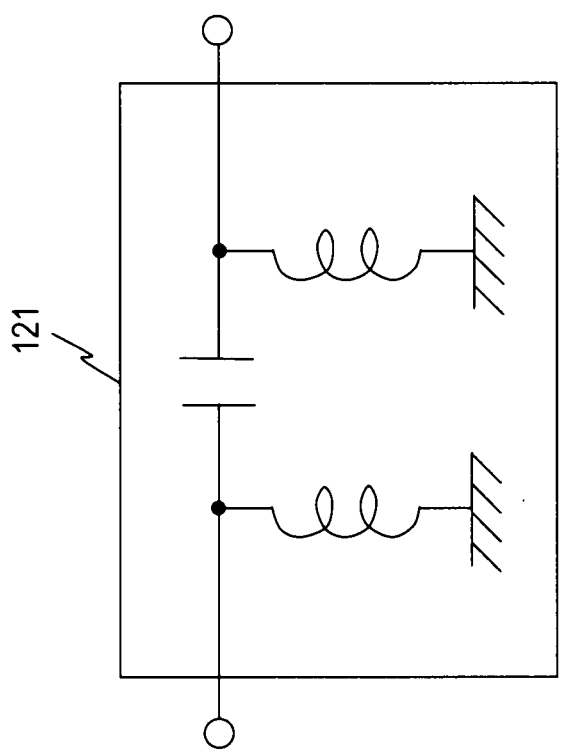
FIG. 15C shows another specific structure of that shown in FIG. 15A.
Figure 16B:
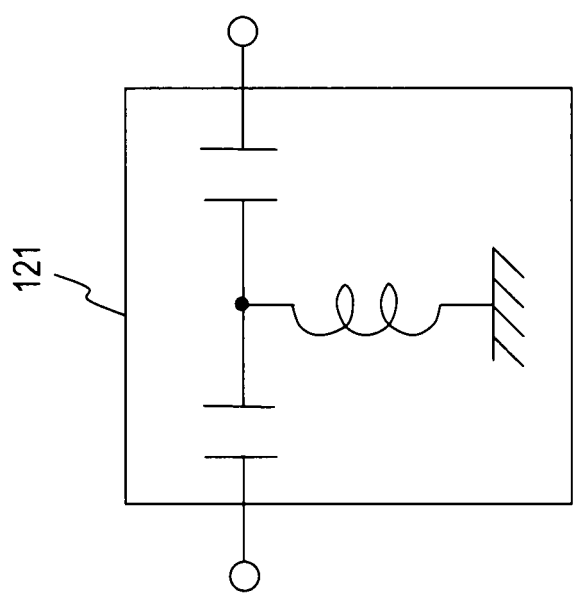
FIG. 16B shows a specific structure of that shown in FIG. 16A.
Figure 16C:
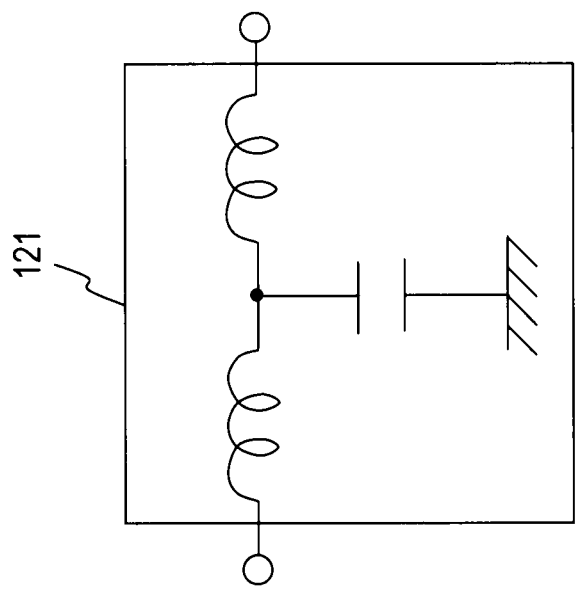
FIG. 16C shows another specific structure of that shown in FIG. 16A.

Here, $Z_1$ and $Z_2$ are pure imaginary numbers. If $Z_1$ and $Z_2$ in $b_1$ have the relationship expressed as $$Z_2 = \frac{2Z_0^2 Z_1}{(Z_1^2 - Z_0^2)} \qquad (2)$$

in FIG. 15A or the relationship expressed as $$Z_2 = \frac{Z_0^2 - Z_1^2}{2Z_1} \qquad (2)$$

in FIG. 16A, the circuit does not affect matching in $b_1$. With the structure shown in FIG. 15A or 16A, the matching state in $b_1$ established by the first matching unit 110 is maintained irrespective of the delay amount of the delay circuit. Just the relationship between $Z_1$ and $Z_2$ is specified here, and the actual structure, such as inductors and capacitors, or a distributed constant circuit or a group of circuit elements having characteristics similar to the inductors and capacitors, can be selected appropriately. Therefore, the characteristic value of each element can be specified to establish impedance matching in $b_2$. If the series matching section 121 is formed of a transmission line, matching is maintained in $b_1$ irrespective of the delay amount. Therefore, the delay amount caused by the transmission line can be specified in a desired manner. The delay amount can be used to establish impedance matching in $b_2$. Specific examples of the structure shown in FIG. 15A are illustrated in FIGS. 15B and 15C. Specific examples of the structure shown in FIG. 16A are also illustrated in FIGS. 16B and 16C. The same effects can be obtained when the structures illustrated in FIGS. 15B and 15C are connected in series or a circuit equivalent to the series connection is used, or when the structures illustrated in FIGS. 16B and 16C are connected in series or a circuit equivalent to the series connection is used.

The first matching unit 110 and the series matching section 121 are disposed in series in a signal path connecting the system circuit 50 and the amplification device 60. The parallel matching section 122 is branched from the signal path and disposed in parallel with the system circuit 50 and the amplification device 60.

The parallel matching section 122 is connected at one end to the signal path at the other end of the series matching section 121, and grounded at the other end. To establish impedance matching in $b_2$, the parallel matching section 122 fulfils a function of specifying an appropriate reactance value to adjust the impedance. The parallel matching section 122, however, should not affect the impedance Z0 in $b_1$ converted by the first matching unit 110. The parallel matching section 122 has two blocks connected in series, so that the function and requirements described above are met. A first parallel block 122a functions as a switch for isolating the parallel matching section 122 from the signal path in $b_1$. A second parallel block 122b is provided to specify an appropriate reactance value for impedance conversion in $b_2$. The second parallel block 122b may be provided as a capacitive reactance block using an open-end line.

Figure 17:
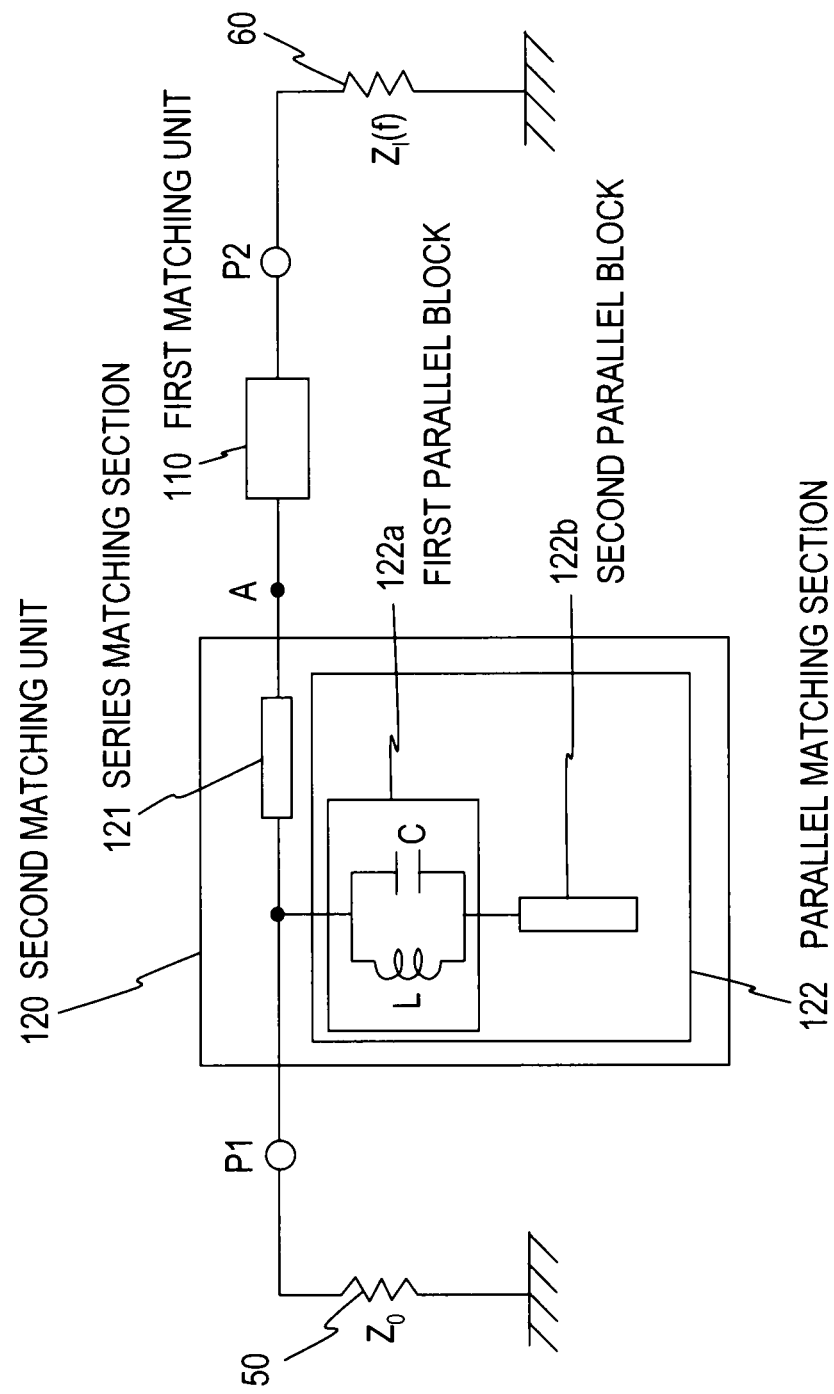
FIG. 17 shows a structure in which a parallel resonance circuit is employed as a first parallel block in the first embodiment.

The first parallel block 122a is designed to open in impedance the connection point to the signal path in $b_1$ (the impedance viewed from the connection point to the parallel matching section 122 is infinite or is so large that matching in $b_1$ is not affected). With this open state in impedance, it can be considered that the parallel matching section 122 is isolated from the signal path, without turning on and off the connection by using a switch. The open state in impedance in $b_1$ can be produced, for example, by forming the first parallel block 122a of a parallel resonance circuit having a resonance frequency equal to $f_1$ made by a capacitor having capacitance C and an inductor having inductance L. Any other configuration is possible. FIG. 17 is a block diagram of a structure having a parallel resonance circuit as the first parallel block 122a and an open-end line as the second parallel block 122b. When the first parallel block 122a is a parallel resonance circuit, the relationship among $f_1$, C, and L is expressed by the following equation.

$$f_1 = \frac{1}{2\pi\sqrt{LC}} \qquad (3)$$

Here, the parallel matching section 122 is present as a specific reactance in $b_2$, and the combination of the first parallel block 122a and the second parallel block 122b integrally forms the parallel matching section 122. The parallel matching section 122 has a function of setting a reactance value for impedance conversion in $b_2$. If the first parallel block 122a is a parallel resonance circuit formed of a capacitor and an inductor, the reactance $Z_{LC}$ of the first parallel block 122a at $f_2$ is expressed as follows.

$$Z_{LC} = \frac{j2\pi f_2 L}{1 - 2\pi f_2 LC} \qquad (4)$$

Figure 18:
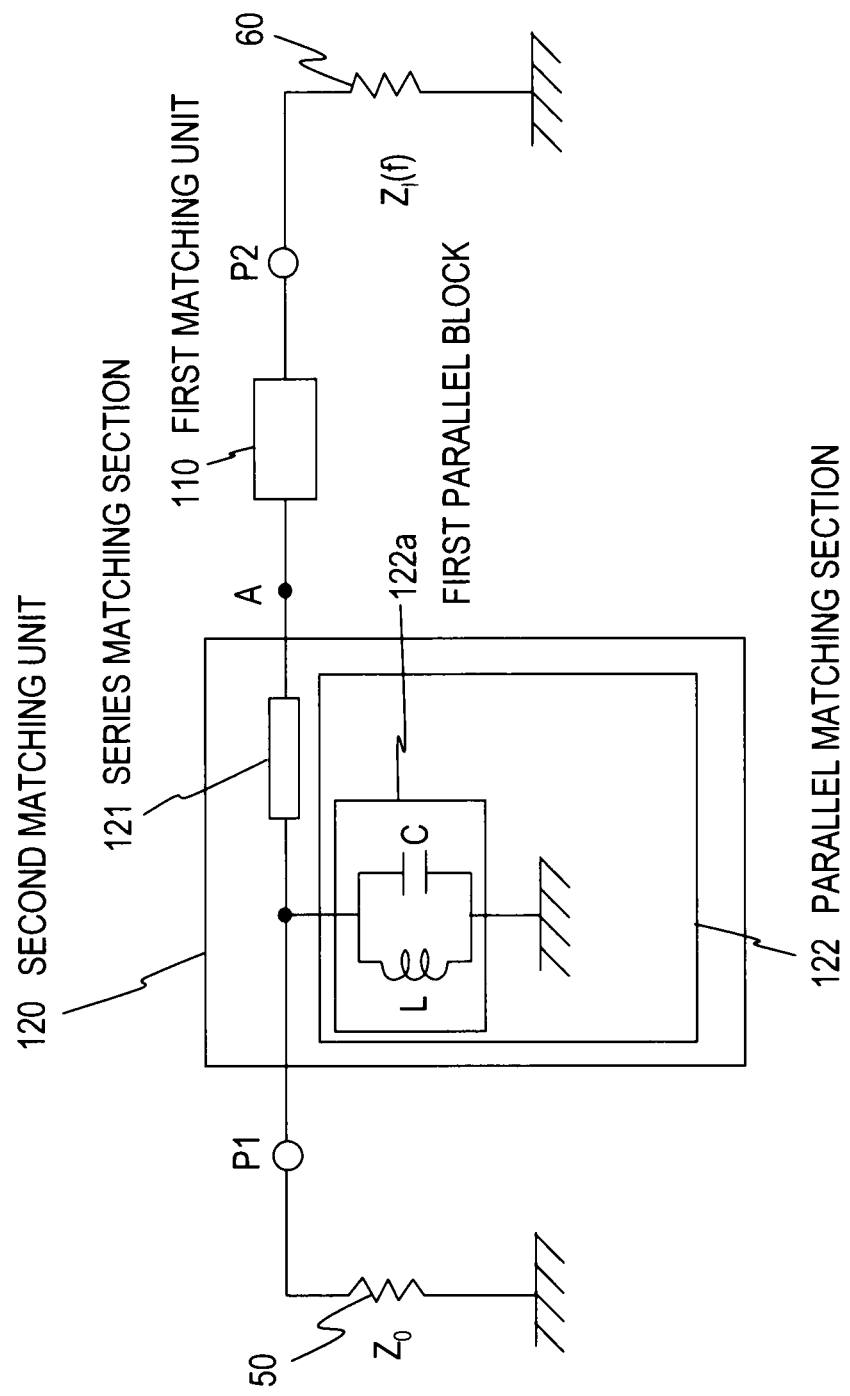
FIG. 18 shows another structure in which a parallel resonance circuit is employed as the first parallel block in the first embodiment.

Therefore, by specifying C and L in such a manner that equation (3) holds if the first parallel block 122a is a parallel resonance circuit and that $Z_{LC}$ in equation (4) becomes the reactance required for impedance matching in $b_2$, the need for the second parallel block 122b is eliminated, and the parallel matching section 122 can be formed just of the first parallel block 122a, as shown in FIG. 18.

Figure 19:
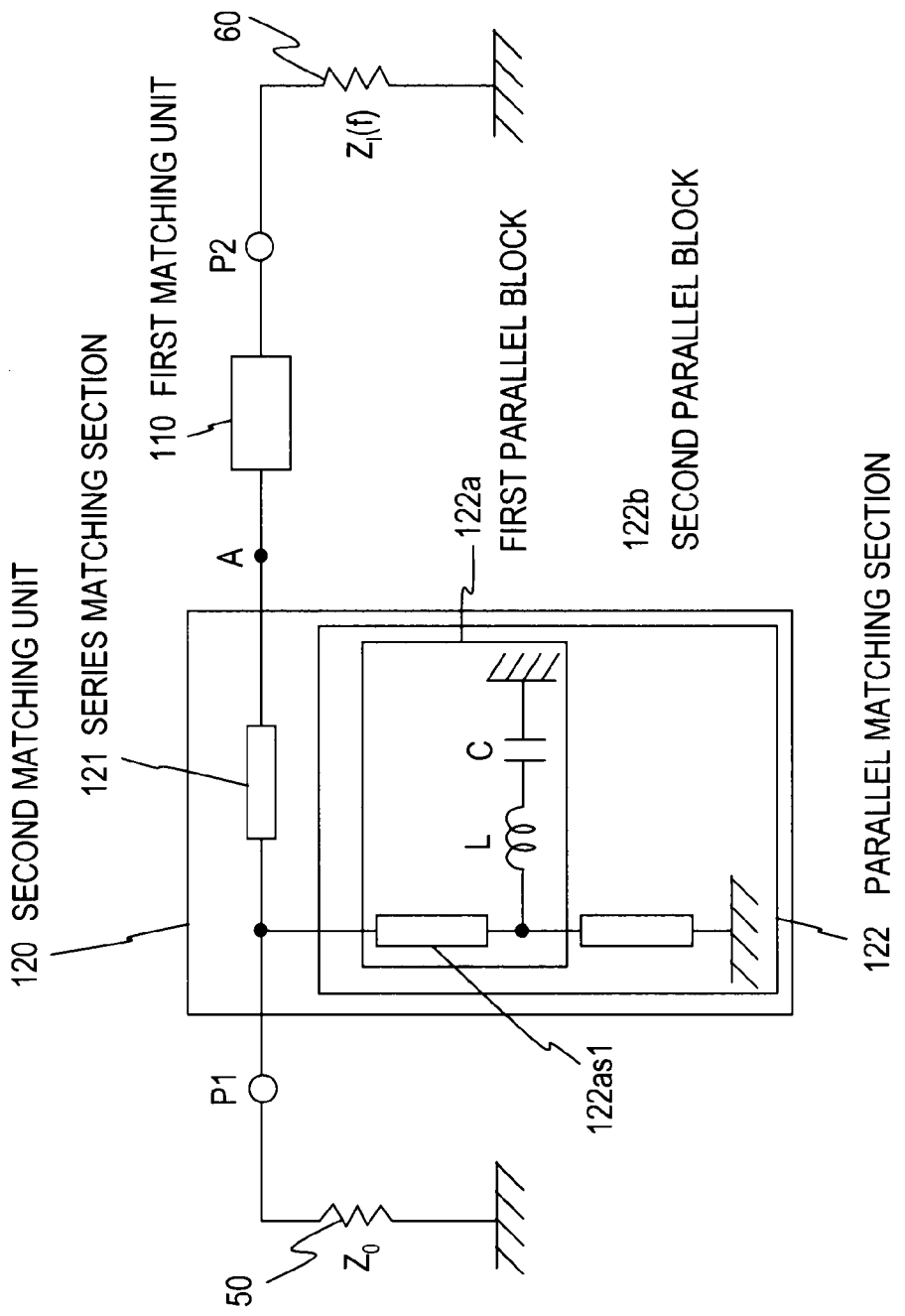
FIG. 19 shows a structure in which a series resonance circuit is employed as the first parallel block in the first embodiment.

The first parallel block 122a can also be formed by a combination of a transmission line 122as1 having a length equal to a quarter of the wavelength $\lambda_1$ at $f_1$ and a series resonator formed of L and C and having a resonance frequency equal to $f_1$, as shown in FIG. 19. In this structure, the transmission line 122as1 is short-circuited in impedance at one end connected to the series resonator, opening in impedance the other end of the transmission line 122as1, regardless of the structure of the second parallel block 122b. Therefore, it can be considered that the parallel matching section 122 is isolated from the circuit. The series resonator is present as a specific reactance in $b_2$. As a result, the combination of the first parallel block 122a and the second parallel block 122b integrally forms the parallel matching section 122 and is present as a specific reactance. The parallel matching section 122 has a function of setting a reactance value for impedance conversion in $b_2$, together with the series matching section 121.

In FIG. 1, the first parallel block 122a is placed on the signal path side, and the second parallel block 122b is placed on the ground side. The positions of the first parallel block 122a and the second parallel block 122b can be exchanged. With the exchanged positions, however, an open portion in impedance occurs at the connection point between the two blocks, so that the second parallel block 122b, connected to the signal path, could affect the impedance matching state in $b_1$. In such a case, the influence can be reduced by using a lumped constant element as the second parallel block 122b.

Then, the connection point to the signal path can be regarded as an open state in impedance in $b_1$, and it can be considered that the parallel matching section 122 is isolated from the signal path. When the first parallel block 122a is on the ground side, the open state in impedance can be created also by using a transmission line having a length equal to a quarter of the wavelength at $f_1$ as the first parallel block 122a. That transmission line can have any impedance, and the impedance may be used as a design parameter for impedance matching in $b_2$.

With the matching units configured as described above, impedance conversion to Z0 by the first matching unit 110 is maintained and matching with Z0 is achieved at P1 in $b_1$, and the impedance is converted to $Z(f_2)$, which is not Z0, by the first matching unit 110 but matching with Z0 is achieved at P1 in $b_2$ for any impedance value of $Z(f_2)$ when the series matching section 121 and the parallel matching section 122 are appropriately designed.

Without switching by using a physical switch, the parallel matching section 122 is connected to the signal path in $b_2$ while the parallel matching section 122 is isolated from the signal path in $b_1$, in an automatic manner. Therefore, with the design described above, even if signals in two frequency bands are input simultaneously, matches are achieved respectively and simultaneously for the signals. In addition, a low-loss multiband matching circuit is implemented, which does not have the on-resistance loss of a physical switch when the switch is used.

Each of the components, sections, and blocks included in the matching circuit 100 can be a single distributed constant line, a single element, a combination of them, a plurality of distributed constant lines, a plurality of elements, or a combination of them, if the corresponding function can be fulfilled. The element can be a linear element such as a resistor (or a variable resistor), a capacitor (or a variable capacitor), or an inductor (or a variable inductor), a non-linear two-terminal element such as a diode, or the like. The element that can be used here is not restricted.

It does not matter whether $f_1$ or $f_2$ is higher, but it is preferable that $f_1$ be higher than $f_2$. The reasons for this include the following: A sufficient bandwidth can be easily kept with that configuration; the values of the inductor and capacitor constituting the parallel resonance circuit can be small; and if the first parallel block 122a is a transmission line, the length of the line can be reduced by using the higher frequency as $f_1$.

MODIFICATION

Figure 3:
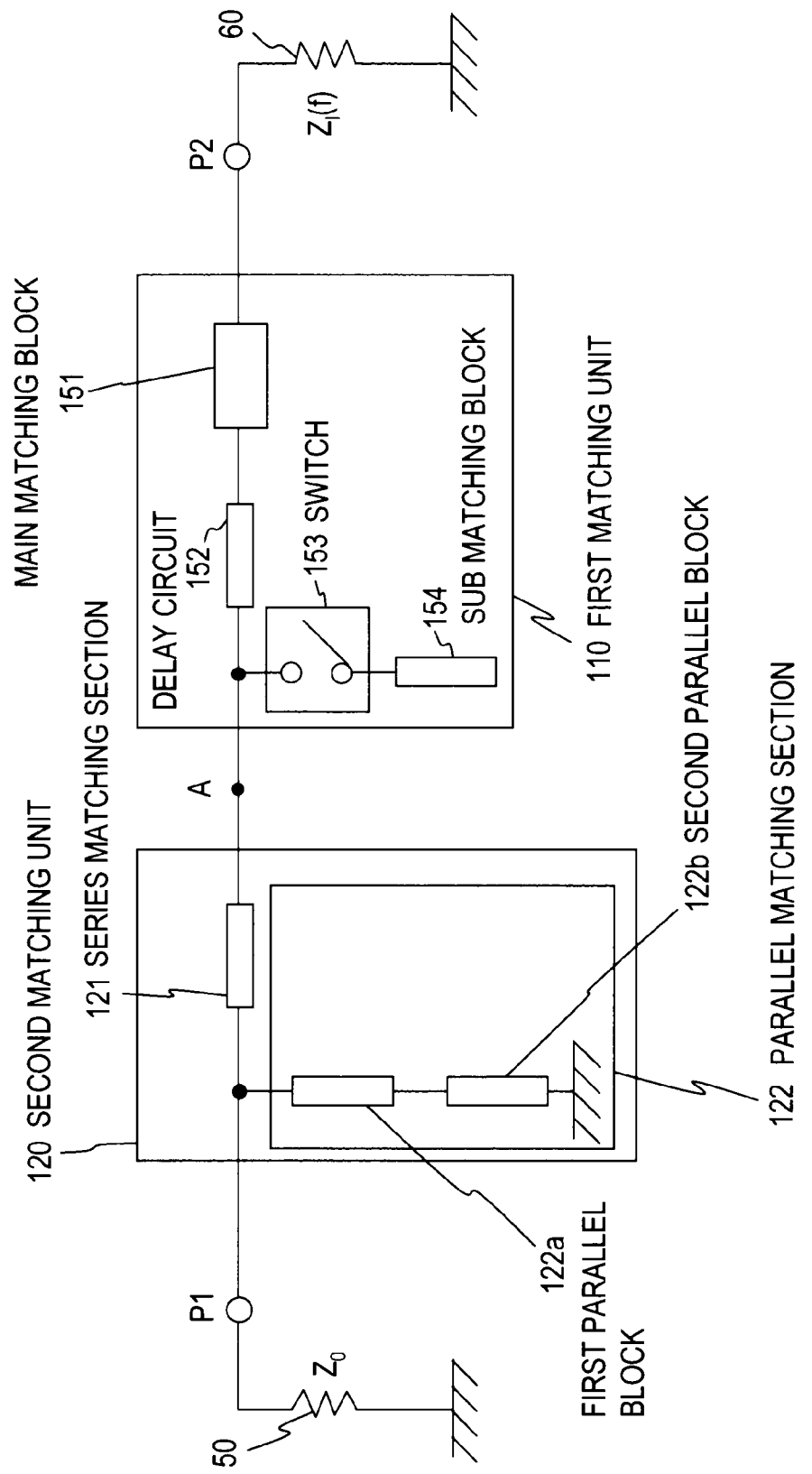
FIG. 3 is a functional block diagram of a multiband matching circuit according to a modification of the first embodiment.
Figure 4:
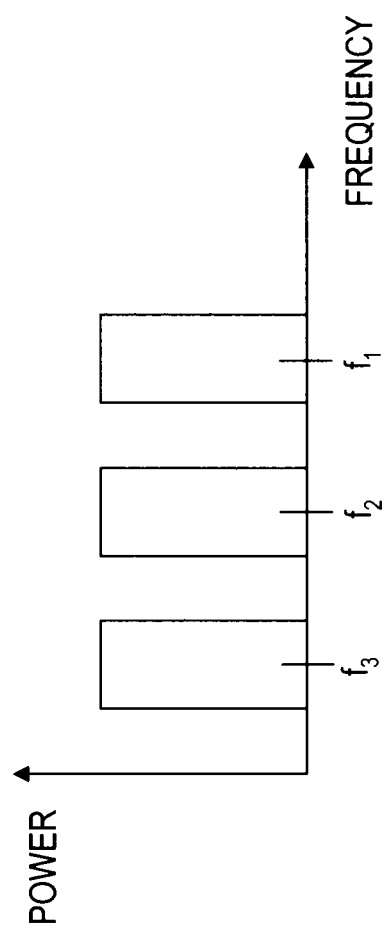
FIG. 4 is a view illustrating the relationship among three frequency bands.

FIG. 3 shows a matching circuit 150 according to a modification of the first embodiment. In the matching circuit 150, a dual-band matching circuit disclosed in Atsushi Fukuda, et al., "Multi-band Power Amplifier Employing MEMS Switches for Optimum Matching," the Institute of Electronics, Information and Communication Engineers, General Conference 2004, c-2-4, p. 39, is used as the first matching unit 110 of the first embodiment. The matching circuit 150 allows, among the central frequencies $f_1$, $f_2$, and $f_3$ shown in FIG. 4 of three frequency bands, either a set of $f_1$ and $f_3$ or a set of $f_2$ and $f_3$ to be selected and matching to be achieved simultaneously for the selected set of frequency bands.

The first matching unit 110 includes a main matching block 151, a delay circuit 152, a switch 153, and a sub matching block 154. The first matching unit 110 converts an impedance $Z_1(f_1)$ in $b_1$ or $Z_1(f_2)$ in $b_2$ of the amplification device 60 to Z0, as selected by switching the switch 153. The principle of this conversion will be described briefly. The delay circuit 152 is formed of a transmission line whose characteristic impedance is Z0 in $b_1$. The main matching block 151 converts the impedance from $Z_1(f_1)$ to Z0 in $b_1$. Since the characteristic impedance of the delay circuit 152 is Z0, matching with Z0 is established at a point A when the switch 153 is in the off state. The main matching block 151 converts the impedance from $Z_1(f_2)$ to $Z(f_2)$, which is not Z0, in $b_2$. By appropriately setting the delay amount of the delay circuit 152 and the reactance of the sub matching block 154, matching with $Z_0$ is established at a point P1 for any value of $Z(f_2)$ when the switch 153 is in the on state. In the principle described above, when the switch 153 is in the off state, the impedance viewed from points A to P2 in FIG. 3 in $b_1$ is converted to Z0, and when the switch 153 is in the on state, the impedance in $b_2$ is converted to Z0. The impedance in a third frequency band b3 (central frequency f3) is converted to $Z(f_3)$ when the switch is in the off state, and to $Z'(f_3)$ when the switch is in the on state.

A second matching unit 120 needs to have a structure in which a matching state (impedance Z0) established by the first matching unit 110 in either $b_1$ or $b_2$ according to the state of the switch 153 is maintained also at the point P1, and the impedance viewed from the points P1 to P2 can be converted to Z0 in $b_3$. Thus, the second matching unit 120 is configured as described below.

Figure 20A:
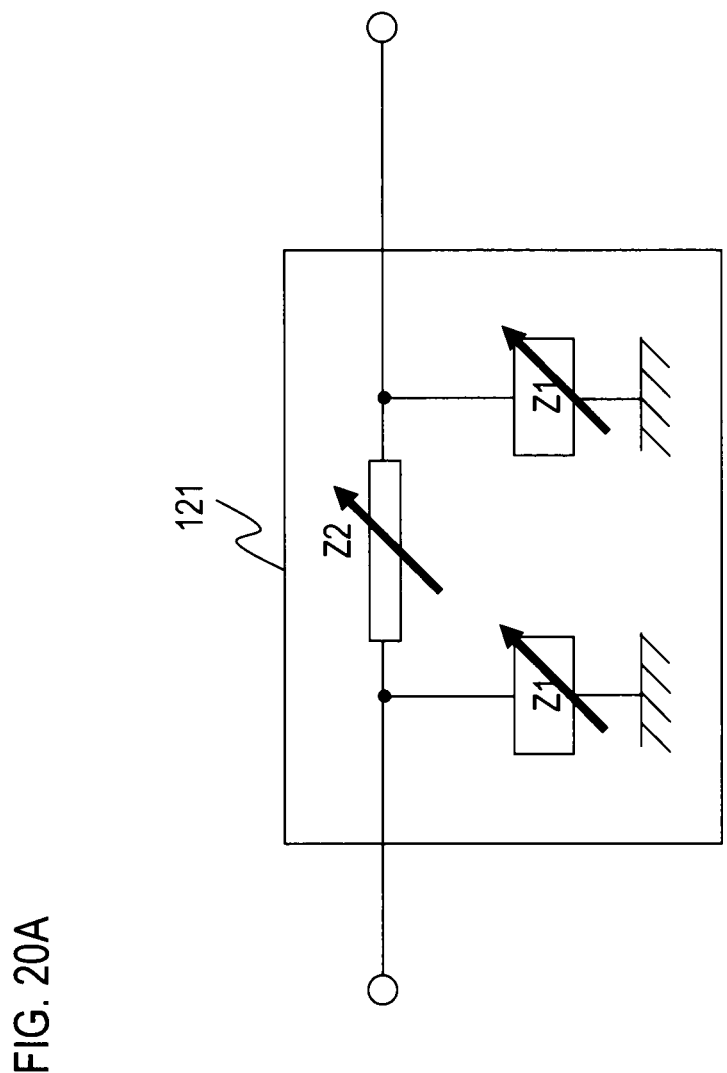
FIG. 20A shows the structure of a circuit equivalent to a transmission line whose characteristic impedance is Z0 at least in $b_1$ and $b_2$.
Figure 20B:
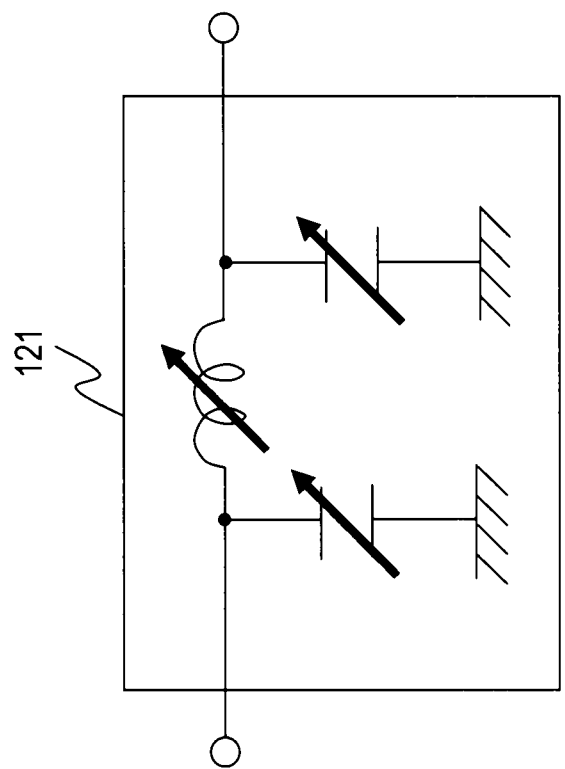
FIG. 20B shows a specific structure of that shown in FIG. 20A.
Figure 20C:
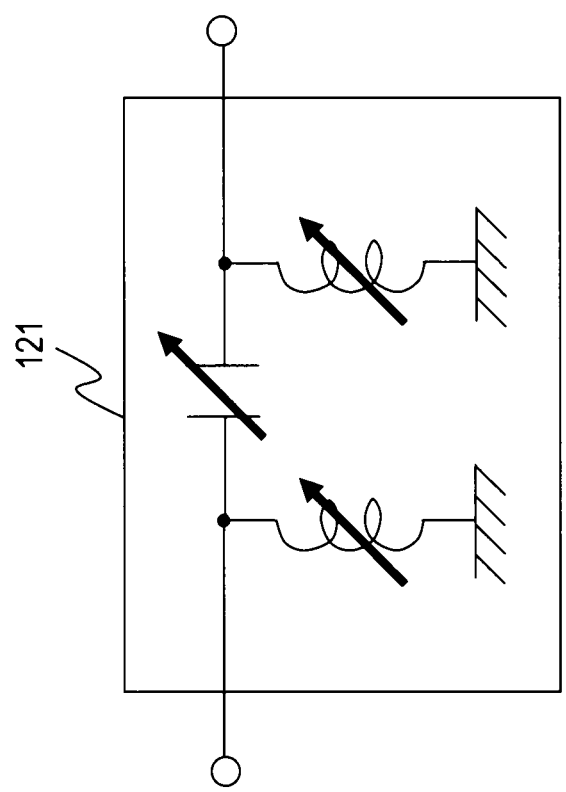
FIG. 20C shows another specific structure of that shown in FIG. 20A.
Figure 21A:
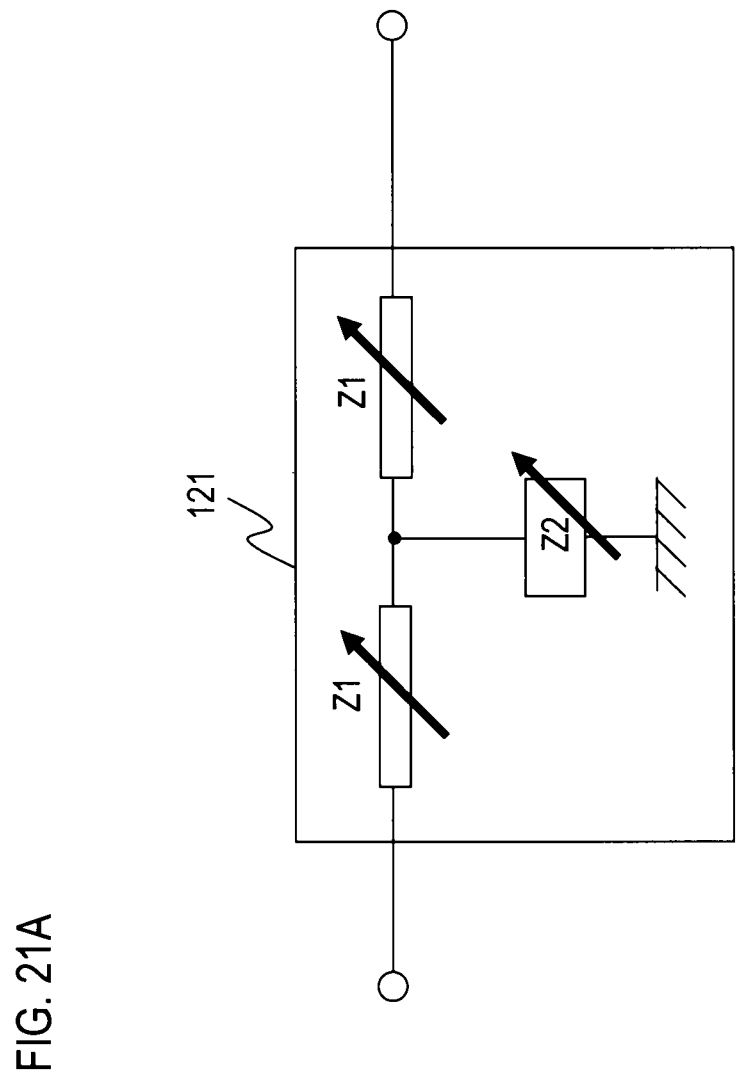
FIG. 21A shows another structure of the circuit equivalent to the transmission line whose characteristic impedance is Z0 at least in $b_1$ and $b_2$.
Figure 21B:
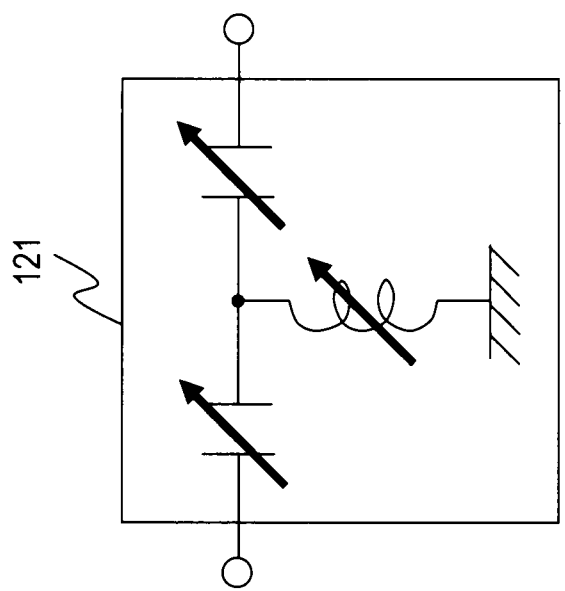
FIG. 21B shows a specific structure of that shown in FIG. 21A.
Figure 21C:
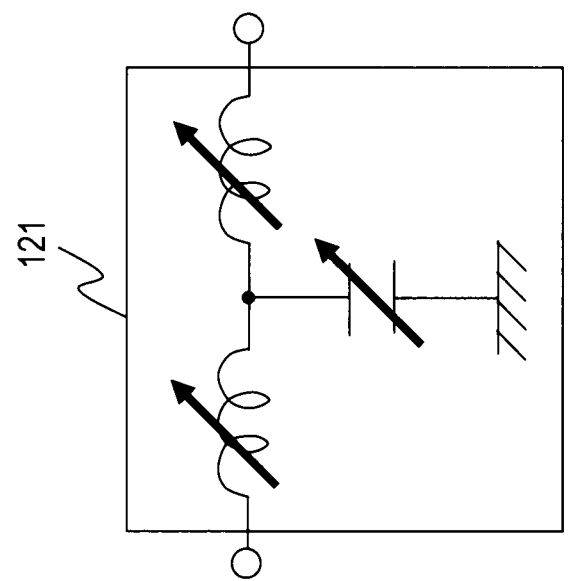
FIG. 21C shows another specific structure of that shown in FIG. 21A.
Figure 22A:
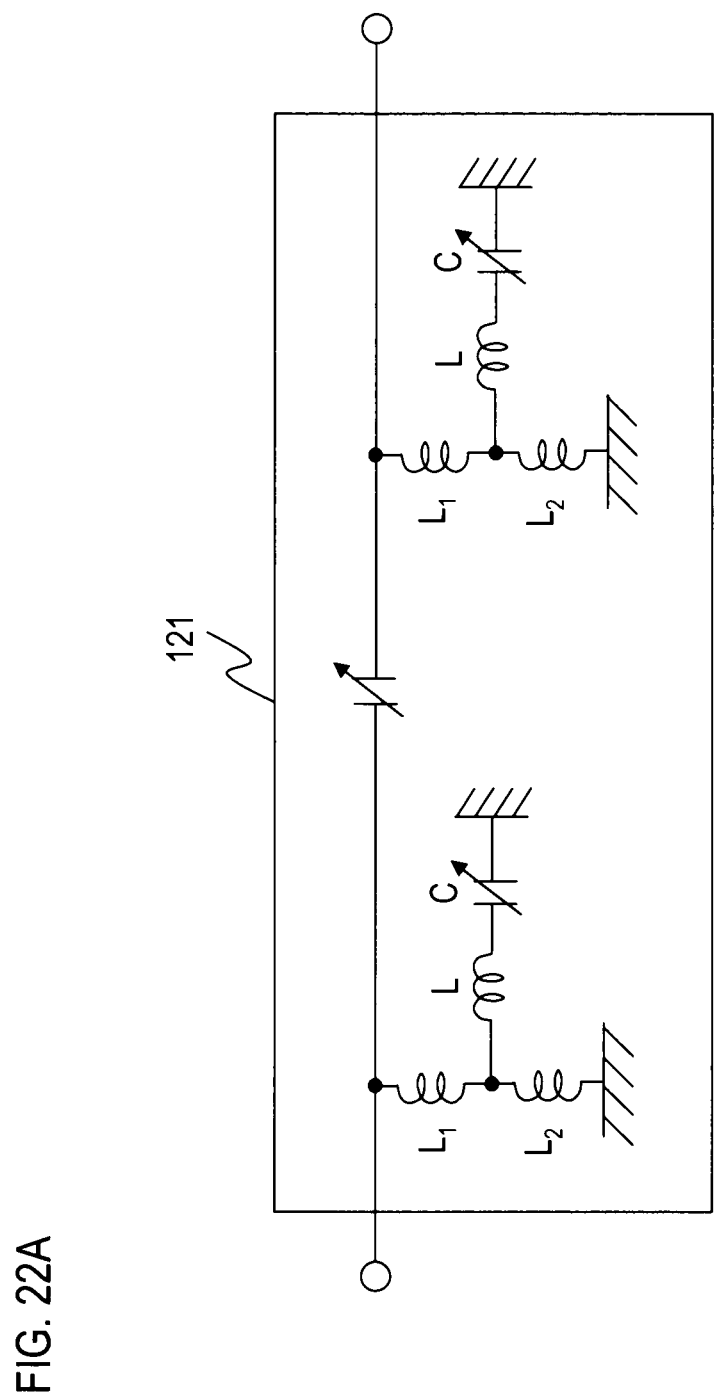
FIG. 22A shows a structure in which variable inductors shown in FIG. 20C are replaced with variable capacitors and other elements.
Figure 22B:
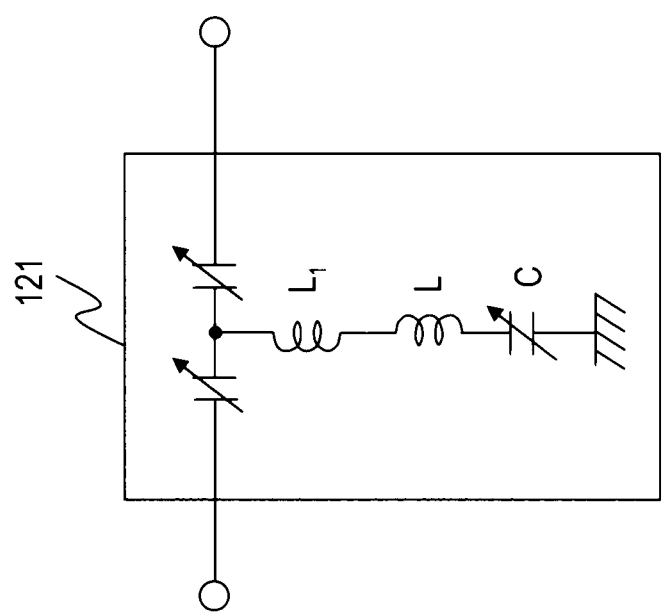
FIG. 22B shows a structure in which a variable inductor shown in FIG. 21B is replaced with a variable capacitor and other elements.
Figure 22C:
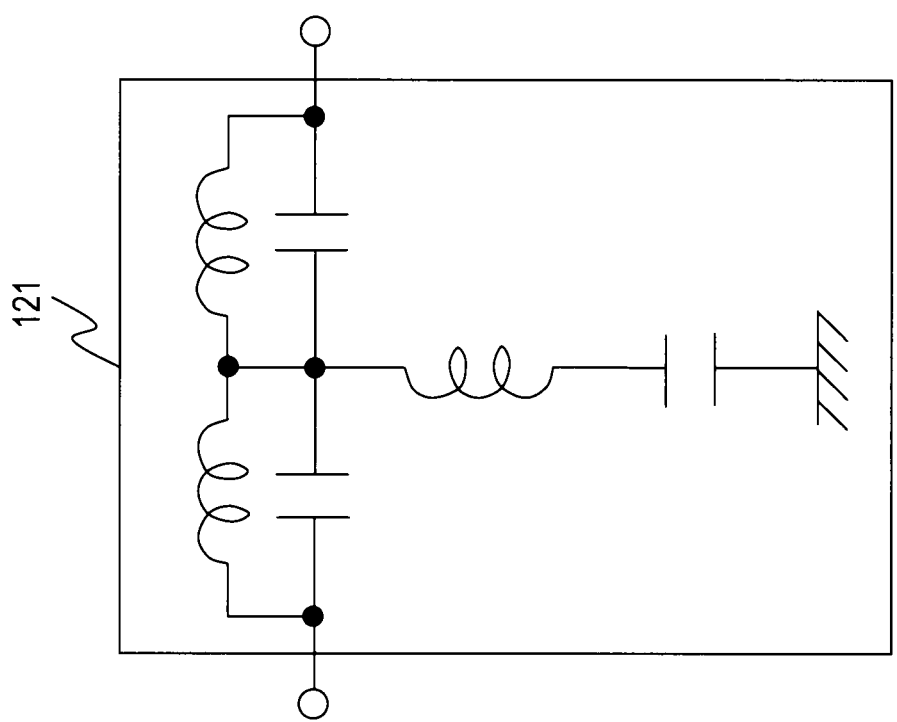
FIG. 22C shows a structure in which the elements of FIG. 21A are formed of parallel connections and a series connection of inductors and capacitors.

A series matching section 121 is formed of a transmission line whose characteristic impedance is Z0 or a delay circuit equivalent to the transmission line in at least $b_1$ and $b_2$ so as to maintain the matching state in $b_1$ and $b_2$. Example circuits equivalent to the transmission line at least in $b_1$ and $b_2$ are illustrated in FIGS. 20A and 21A. Variable elements are adjusted such that $Z_1$ and $Z_2$ satisfy expression (1) in FIG. 20A and expression (2) in FIG. 21A at least in $b_1$ and $b_2$. Specific examples of the circuit shown in FIG. 20A are illustrated in FIGS. 20B and 20C. Specific examples of the circuit shown in FIG. 21A are illustrated in FIGS. 21B and 21C. The same effects can be obtained when the structures illustrated in FIGS. 20B and 20C are connected in series or a circuit equivalent to the series connection is used, or when the structures illustrated in FIGS. 21B and 21C are connected in series or a circuit equivalent to the series connection is used. It is difficult to manufacture variable inductors in many cases. However, if a shunt inductor is used, a variable inductor can be formed by using a variable capacitor. FIGS. 22A and 22B show example structures in which variable inductors in FIG. 20C and FIG. 21B are formed by using variable capacitors, respectively. In FIG. 22A, a series connection grounded at one end, of an inductor having an inductance L and a capacitor having a capacitance C forms a series resonator, and the series resonator is designed such that its resonance frequency is the central frequency $f_n$ of the n-th frequency band $b_n$. In that condition, the other end of the series resonator is short-circuited in impedance at $f_n$, and the inductance of the shunt inductor is $L_1$. At the other frequencies, the other end of the series resonator is not short-circuited in impedance, and the inductance of the shunt inductor is $L_1+L_2$. Since the variable capacitor is used in the series resonator, $f_n$ is variable. In addition, if many series resonators are used, more inductances can be handled. Further, the series connection of the inductor having the inductance L and the variable capacitor can be a reactance element having a non-infinite reactance to form $Z_1$ together with the shunt inductor. In FIG. 22B, a shunt inductor is connected to a capacitor having a capacitance C grounded at one end. A series connection of an inductor having an inductance $L_1$ which is a part of the shunt inductor, and the capacitor having the capacitance C forms a series resonator, and the series resonator is designed such that its resonance frequency is $f_n$. In that condition, the connection point of the shunt inductor and the series resonator is short-circuited in impedance at $f_n$, and the inductance of the shunt inductor is $L_1$. At the other frequencies, a short-circuit state in impedance is located differently, and therefore, the inductance of the shunt inductor can be changed depending on the frequency. In addition, if a variable capacitor is used as the capacitor, more inductances can be handled. Further, the series connection of the inductor having the inductance L and the variable capacitor can be a reactance element having a non-infinite reactance to form $Z_1$ together with the shunt inductor. Making a shunt inductor variable in this manner can also be applied to other embodiments that use similar shunt reactances. In the above-described embodiment, structures in which only a variable capacitor is used without using a variable shunt inductor can be made. As shown in FIG. 22C, each element in FIG. 21A can be formed of a series connection or a parallel connection of an inductor and a capacitor. The parallel connection of these elements can have a inductive reactance and a capacitive reactance according to the frequency with the resonance frequency serving as a boundary. Therefore, when the parallel connection is designed so as to have a desired reactance in $b_1$ and $b_2$, expression (2) is satisfied in each frequency. FIG. 22C shows just one example, and many variations can be considered according to the same idea. When variable devices are used as these elements, more variations can be considered.

Figure 5:
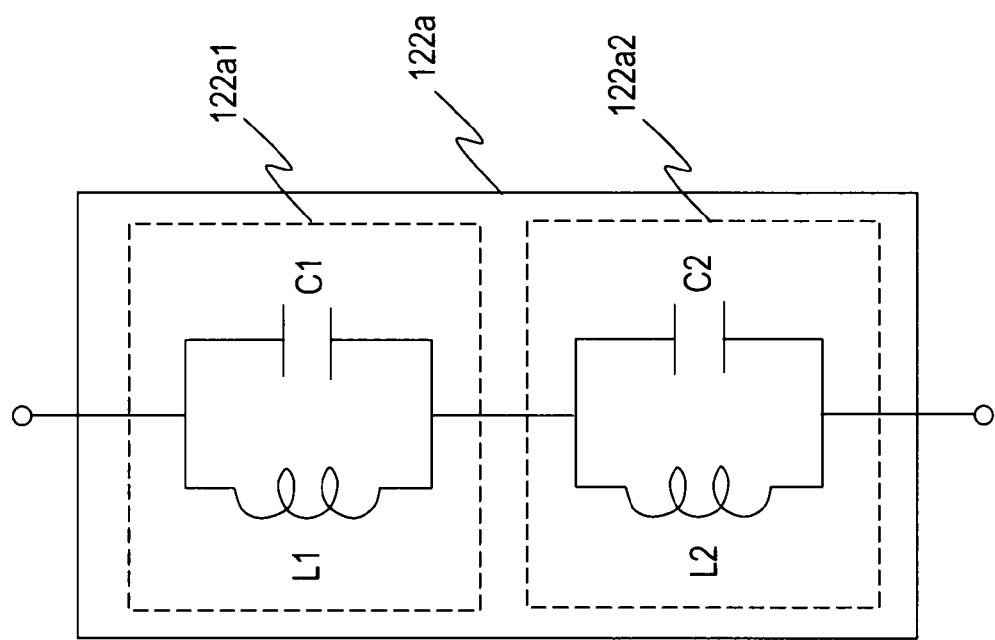
FIG. 5 is a view illustrating a first parallel block formed of two LC resonance circuits.
Figure 23:
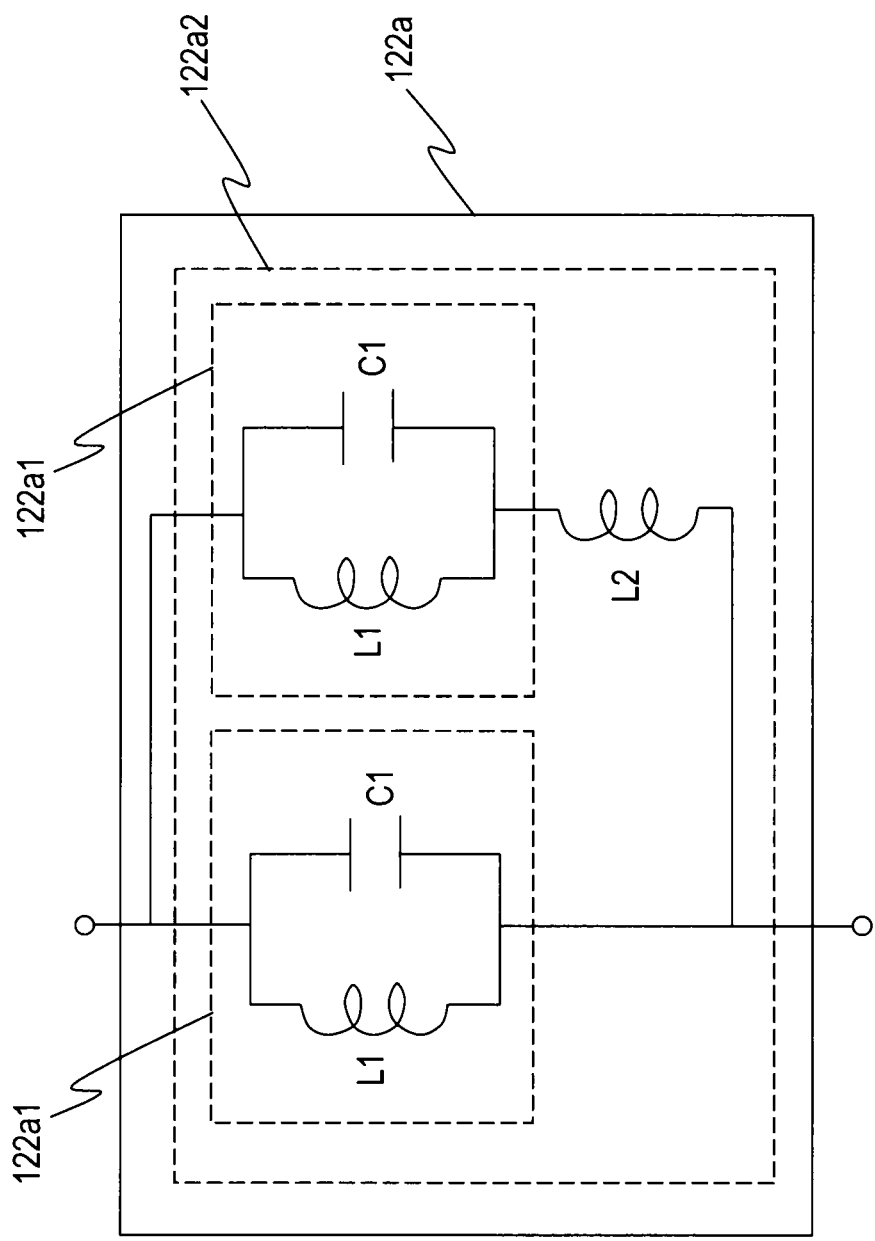
FIG. 23 shows a structure in which a parallel resonance circuit is employed in a first parallel block in the second embodiment.
Figure 24:
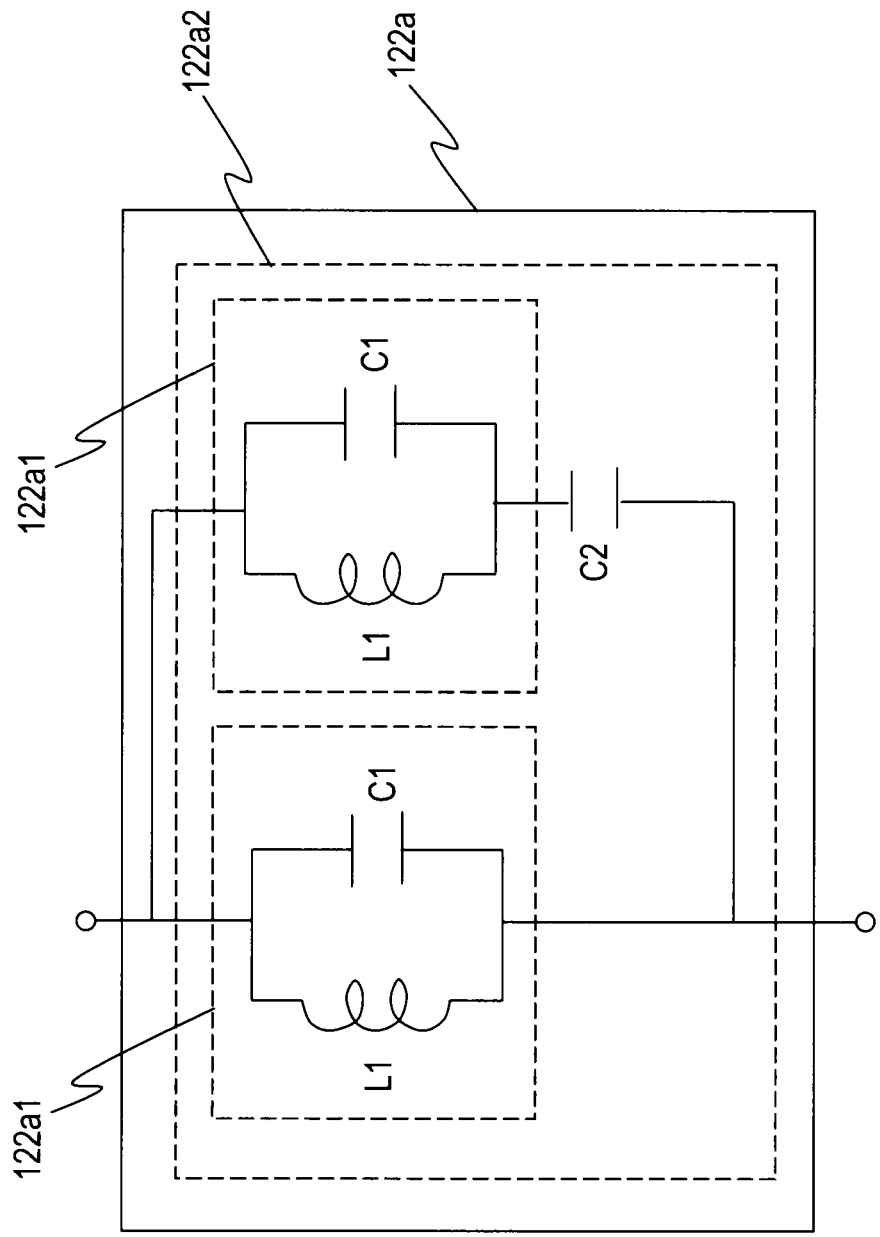
FIG. 24 shows another structure in which a parallel resonance circuit is employed in the first parallel block in the second embodiment.
Figure 25:
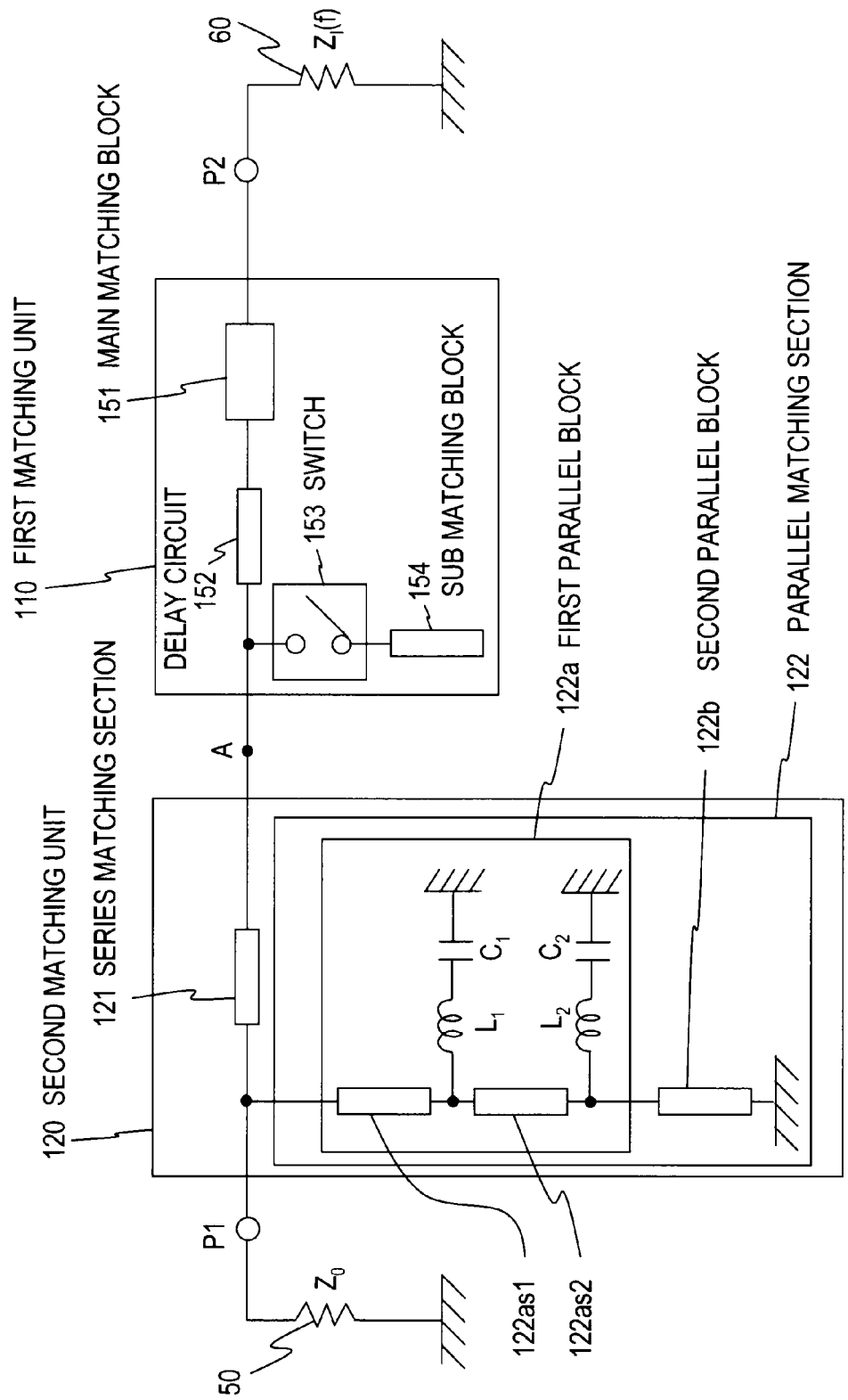
FIG. 25 shows a structure in which series resonance circuits are employed in the first parallel block in the second embodiment.

The first parallel block 122a is designed to open in impedance the connection point to the signal path in $b_1$ and $b_2$. For example, the first parallel block 122a can be formed of a parallel circuit of a variable capacitor and an inductor. The capacitance of the capacitor is changed according to the state of the switch 153 to resonate at $f_1$ when the switch 153 is off and to resonate at $f_2$ when the switch 153 is on. Alternatively, the first parallel block 122a can be formed of a parallel circuit of a fixed capacitor and an inductor, having a resonance frequency equal to or higher than $f_2$ and equal to or lower than $f_1$. The open state in impedance in each of the frequency bands can be implemented also by a series connection of parallel resonance circuits 122a1 and 122a2 of fixed capacitors and inductors, the circuits respectively corresponding to the frequency bands, as shown in FIG. 5, or by a structure in which parallel resonance circuits 122a1 for $b_1$ and a resonance circuit 122a2 for $b_2$ formed by adding an inductor or capacitor to one of the parallel resonance circuits 122a1, as shown in FIG. 23 or 24. In the structure shown in FIG. 5, if a transmission line is placed in the signal path side of the parallel resonance circuit 122a1 or between the parallel resonance circuit 122a1 and the parallel resonance circuit 122a2 and if the length is adjusted appropriately, the transmission line can be used for matching in $b_1$ or $b_2$. FIG. 6 shows impedance versus frequency characteristics of the structure shown in FIG. 5, where the parallel resonance circuit 122a1 has a resonance frequency of 2.6 GHz, and the parallel resonance circuit 122a2 has a resonance frequency of 1.5 GHz. A solid line represents the characteristic of the parallel resonance circuit 122a1, and dashed lines represent the characteristics exhibited by a series connection of the parallel resonance circuit 122a1 and the parallel resonance circuit 122a2. The dashed lines in FIG. 6 indicate that the open state in impedance can be implemented in the two frequency bands. In FIG. 5, the two parallel resonance circuits of capacitors and inductors are connected in series. One parallel resonance circuit may be used instead if one or both of the capacitor and inductor used are variable. The first parallel block 122a can be formed by a combination of a transmission line 122as1 having a length equal to a quarter of the wavelength $\lambda_1$ at $f_1$ and a series resonator having a resonance frequency equal to $f_1$ and formed of $L_1$ and $C_1$ and a combination of a transmission line 122as2, whose length plus the length of the transmission line 122as1 in total becomes a quarter of the wavelength $\lambda_2$ at $f_2$, and a series resonator having a resonance frequency equal to $f_2$ and formed of $L_2$ and $C_2$, as shown in FIG. 25. In this structure, since one end of the transmission line 122as1 where the series resonator formed of $L_1$ and $C_1$ is connected is short-circuited in impedance in $b_1$, the other end of the transmission line 122as1 becomes open in impedance, so that it can be considered that the parallel matching section 122 is isolated from the circuit. In $b_2$, since one end of the transmission line 122as2 where the series resonator formed of $L_2$ and $C_2$ is connected becomes short-circuited in impedance, the end of the transmission line 122as1 in the signal path side becomes open in impedance, the transmission lines 122as1 and 122as2 integrally forming a line having a length equal to a quarter of the wavelength $\lambda_2$, so that it can be considered that the parallel matching section 122 is isolated from the circuit. In $b_3$, the parallel matching section 122 is present as a specific reactance, and the first parallel block 122a and the second parallel block 122b integrally form the parallel matching section 122, which has the function of specifying the reactance value for impedance conversion in $b_3$. When the number of matching bands increases, the structure shown in FIG. 25 can be used in the same way. The transmission lines 122as1 and 122as2 having adjusted lengths can be used for matching in $b_1$ and $b_2$. In $b_3$, a specific reactance is connected to the signal path. More specifically, the first parallel block 122a and the second parallel block 122b integrally form the parallel matching section 122 and have a function of specifying a reactance for impedance conversion in $b_3$.

Since the impedance to be matched is $Z(f_3)$ when the switch 153 is off and $Z'(f_3)$ when the switch 153 is on, if $Z(f_3)$ and $Z'(f_3)$ are different largely, the structure shown in FIG. 20A or 21A is used as the series matching section 121 and the second parallel block 122b is also configured to have a variable reactance to change the reactance according to the state of the switch 153, for example.

The positions of the first parallel block 122a and the second parallel block 122b can be exchanged. With the exchanged positions, however, an open portion in impedance occurs at the connection point between the two blocks, so that the second parallel block 122b connected to the signal path could affect the impedance matching state in $b_1$. This influence can be reduced by using a lumped constant element as the second parallel block 122b. Then, the connection point to the signal path can be brought to an open state in impedance, and it can be considered that the parallel matching section 122 is isolated from the signal path. If the first parallel block 122a is on the ground side, the open state in impedance can be created also by using a transmission line whose length is greater than or equal to a quarter of the wavelength at $f_1$ and smaller than or equal to a quarter of the wavelength at $f_2$, as the first parallel block 122a. If the two frequencies are widely separated, the length can be a quarter of the wavelength at the average frequency of the central frequencies. That transmission line can have any impedance, and the impedance of the line in $b_3$ may be used as a design parameter for impedance matching in $b_3$.

Figure 7B:
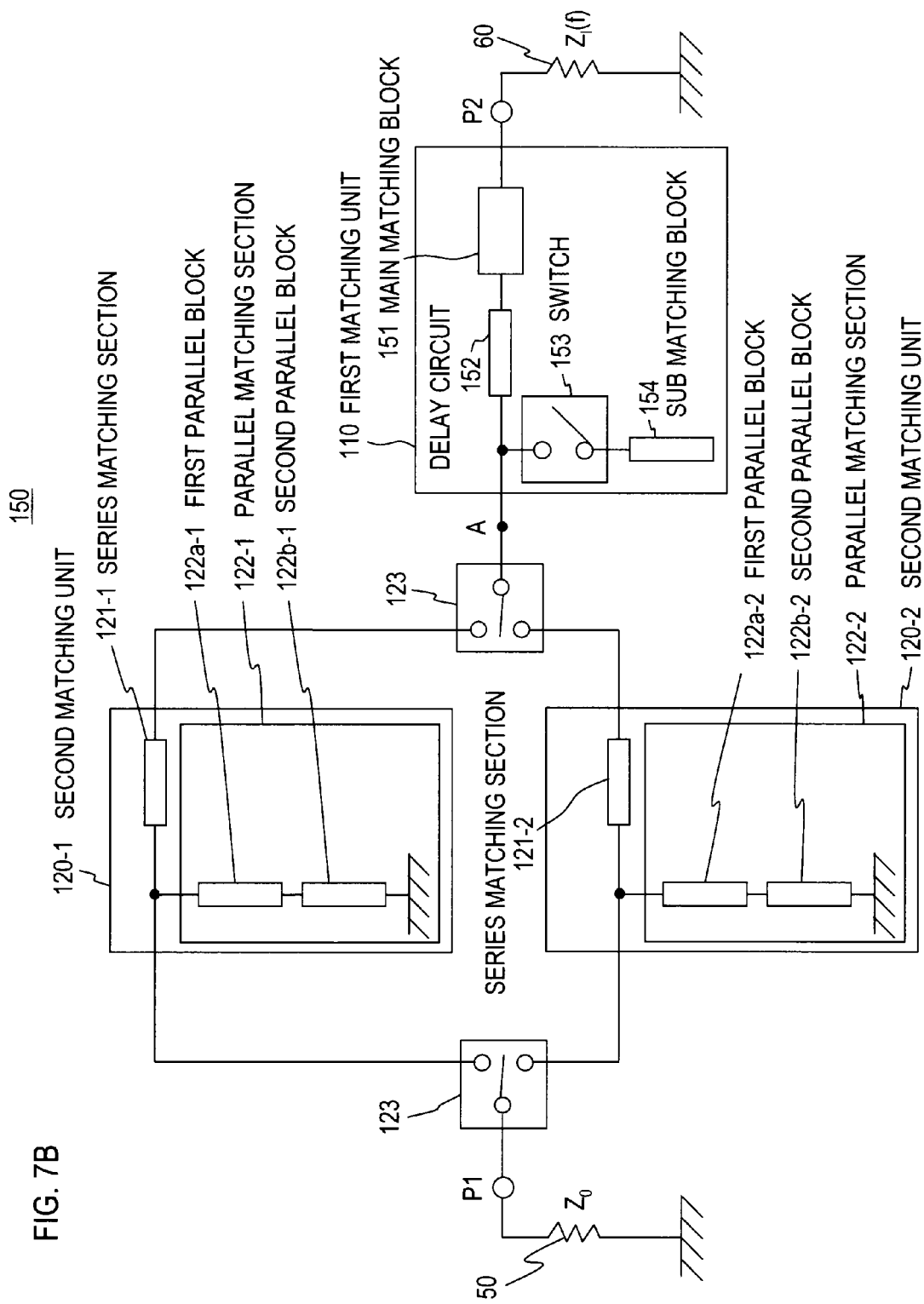
FIG. 7B is a functional block diagram of a structure in which two second matching units are connected in parallel, the units being the same as the second matching unit in the multiband matching circuit according to the modification of the first embodiment.

As shown in FIG. 7A, two second matching units 120' (second matching unit 120'-1 and second matching unit 120'-2) configured to establish matching between $Z(f_3)$ and Z0 and between $Z'(f_3)$ and Z0 in $b_3$ may be connected in series. The second matching unit 120'-1 and the second matching unit 120'-2 include the second matching unit 120 and a switch 123', as shown in FIG. 7A, and the switch 123' is switched in accordance with the state of the switch 153. If the switch 153 is off, the switch 123'-1 is turned on and the switch 123'-2 is turned off (first state). If the switch 153 is on, the switch 123'-1 is turned off, and the switch 123'-2 is turned on (second state). These settings allow matching to be established in $b_1$ and $b_3$ simultaneously in the first state and matching to be established in $b_2$ and $b_3$ simultaneously in the second state. In the first state, matching with Z0 in $b_3$ is established by the second matching unit 120'-1, and the matching state must be maintained even after the second matching unit 120'-2, so that the series matching section 121'-2 of the second matching unit 120'-2 must be formed of a transmission line having a characteristic impedance equal to Z0, or a delay circuit made by a circuit equivalent to the transmission line even in $b_3$. In that case, the first parallel block 122a'-1 and the first parallel block 122a'-2 should be configured to open in impedance the connection points to the signal path in $b_1$ and in $b_2$, respectively. As shown in FIG. 7B, two second matching units 120 (second matching unit 120-1 and second matching unit 120-2) configured to establish matching between $Z(f_3)$ and Z0 and between $Z'(f_3)$ and Z0 in $b_3$ may be selected by two SPDT switches 123 in accordance with the state of the switch 153. When the switch 153 is off, the second matching unit 120-1 is selected, and when the switch 153 is on, the second matching unit 120-2 is selected. Then, if the switch 153 is off, whatever value $Z(f_3)$ is, matching in $b_1$ and $b_3$ can be established simultaneously. If the switch 153 is on, whatever value $Z'(f_3)$ is, matching in $b_2$ and $b_3$ can be established simultaneously.

The positions of the first parallel block 122a and the second parallel block 122b may be exchanged. With the exchanged positions, however, an open portion in impedance occurs at the connection point between the two blocks, and the second parallel block 122b connected to the signal path could affect the impedance matching states in $b_1$ and $b_2$. The influence can be reduced by providing a lumped constant element as the second parallel block 122b. Then, the connection point to the signal path can be brought to an open state in impedance, and it can be considered that the parallel matching section 122 is isolated from the signal path. When the first parallel block 122a is in the ground side, an open state in impedance can be created also by using a transmission line having a length of a quarter of the wavelength at $f_1$ as the first parallel blocks 122a-1 and 122a'-1 and using a transmission line having a length equal to a quarter of the wavelength at $f_2$ as the first parallel blocks 122a-2 and 122a'-2.

Second Embodiment

Figure 8:
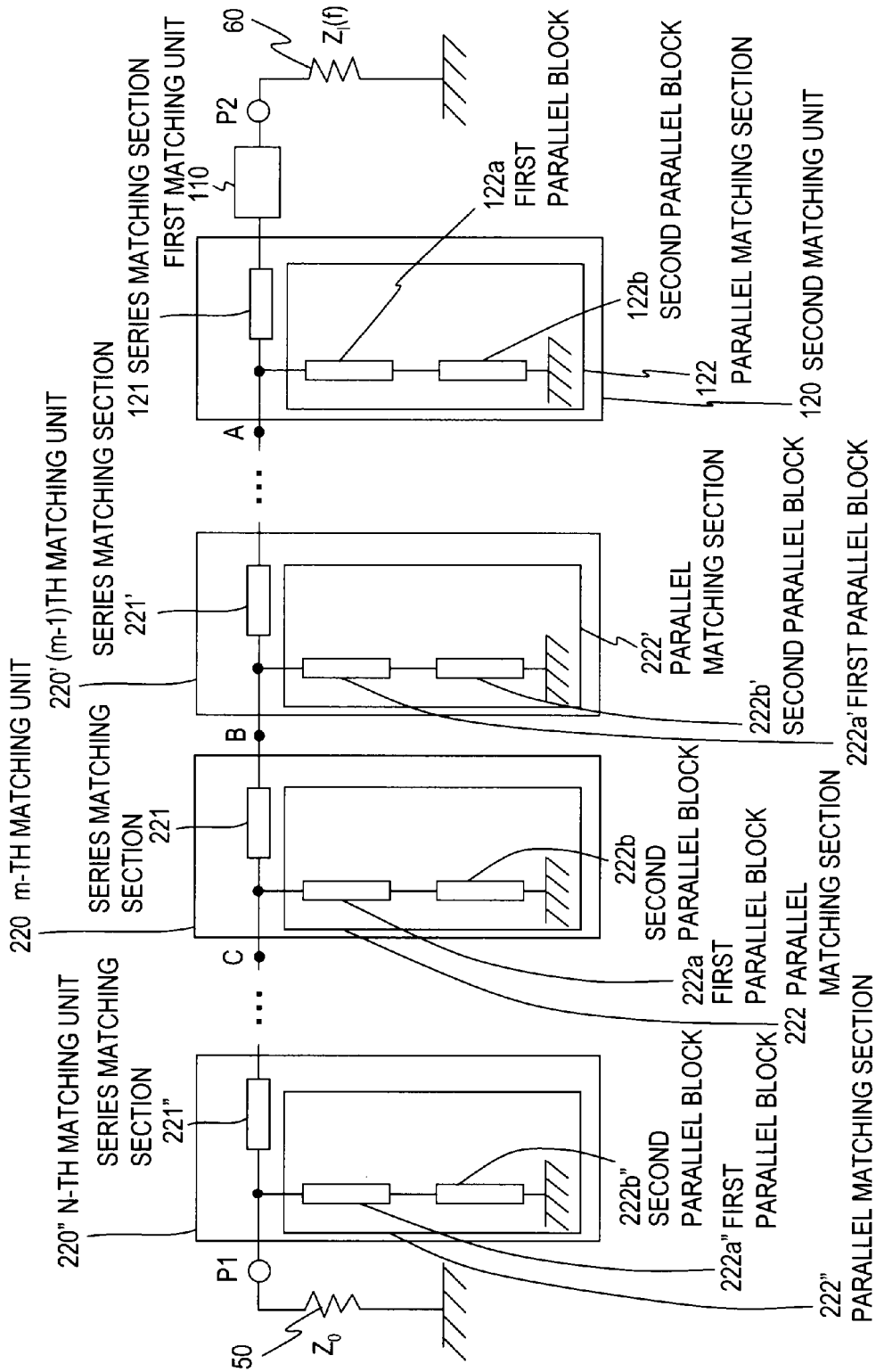
FIG. 8 is a functional block diagram of a multiband matching circuit according to a second embodiment.
Figure 9:
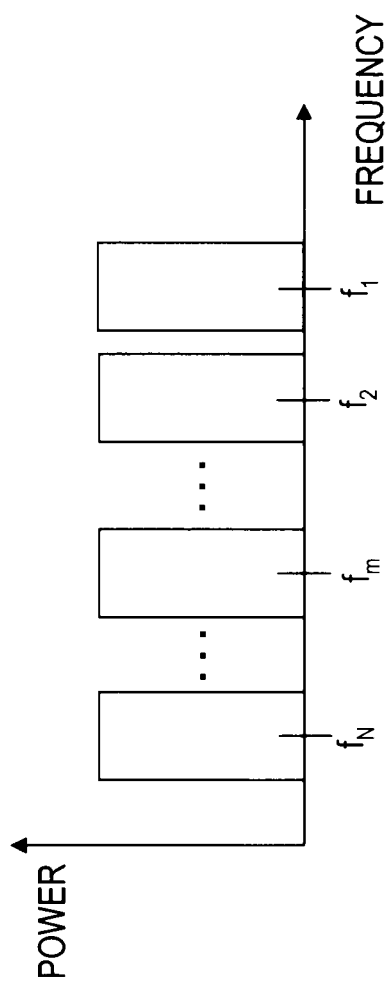
FIG. 9 is a view illustrating the relationship among N frequency bands.

A matching circuit 200 according to a second embodiment is shown in FIG. 8. The matching circuit 200 is provided for signals in first to N-th frequency bands with the central frequencies $f_1, f_2, \ldots,$ and $f_N$, as shown in FIG. 9. When disposed on a signal path between an amplification device 60 having an impedance $Z_1(f)$ dependent on frequency characteristics and a circuit (system circuit 50) having a predetermined impedance Z0, the matching circuit 200 matches the impedance $Z_1(f)$ of the amplification device 60 with the impedance Z0 of the system circuit 50.

The matching circuit 200 includes a first matching unit 110 and m-th matching units 220 (m=2, 3, ... N). Each of the m-th matching units 220 includes a series matching section 221 and a parallel matching section 222 (for convenience of explanation, when m=2, the components may also be referred to as the second matching unit 120, the series matching section 121, and the parallel matching section 122, as in the first embodiment).

The first matching unit 110 and the second matching unit 120 in the matching circuit 200 have the same functions as those in the matching circuit 100 in the first embodiment. The impedances $Z_1(f_1)$ and $Z_1(f_2)$ of the amplification device 60 in $b_1$ and $b_2$ are converted by the first matching unit 110 and the second matching unit 120 in $b_1$ and $b_2$, and the impedances viewed from points A to P2 is Z0 in FIG. 8.

The m-th matching unit 220 converts $Z(f_m)$ viewed from points B to P2 in FIG. 8, which is not Z0, so that the impedance viewed from points C to P2 becomes Z0 in the m-th frequency band $b_m$ (central frequency $f_m$).

The series matching section 221 in the m-th matching unit 220 is connected at one end to one end of the series matching section 221' in the (m−1)-th matching unit 220' and is connected at the other end to one end of the series matching section in the (m+1)-th matching unit. If m=N (N-th matching unit 220''), the other end is connected to the system circuit 50. The series matching section 221 of the m-th matching unit 220 is formed of a transmission line whose characteristic impedance is equal to Z0, or a delay circuit made of a circuit equivalent to the transmission line at least in the first to (m−1)-th frequency bands. With this structure, the matching states in the first to (m−1)-th frequency bands established by the first matching unit 110 to the (m−1)-th matching units 220' are maintained irrespective of the series matching section 221 of the m-th matching unit 220. Accordingly, the series matching section 221 of the m-th matching unit 220 can be set appropriately to establish impedance matching in $b_m$. The circuit equivalent to the transmission line at least in $b_1$ to $b_{m-1}$ can be formed of a circuit shown in FIG. 20A, 20B, 20C, 21A, 21B, 21C, 22A, 22B, or 22C.

The series matching section 221 is disposed in series in the signal path between the system circuit 50 and the amplification device 60. The parallel matching section 222 is branched from the signal path and is disposed in parallel with the system circuit 50 and the amplification device 60.

The parallel matching section 222 is connected at one end to the signal path at the other end of the series matching section 221 and is grounded at the other end. The parallel matching section 222 has a function of specifying an appropriate reactance value to adjust the impedance for impedance matching in $b_m$. To establish matching in $b_1$ to $b_{m-1}$ and in $b_m$ simultaneously, the parallel matching section 222 should not affect the impedance Z0 in $b_1$ to $b_{m-1}$ established by the first to (m−1)-th matching units. To satisfy the function requirements, the parallel matching section 222 is formed of a series connection of two blocks. A first parallel block 222a functions like a switch for isolating the parallel matching section 222 from the signal path with respect to signals in all of the frequency bands $b_1$ to $b_{m-1}$. A second parallel block 222b specifies an appropriate reactance value for impedance conversion in $b_m$.

Figure 10:
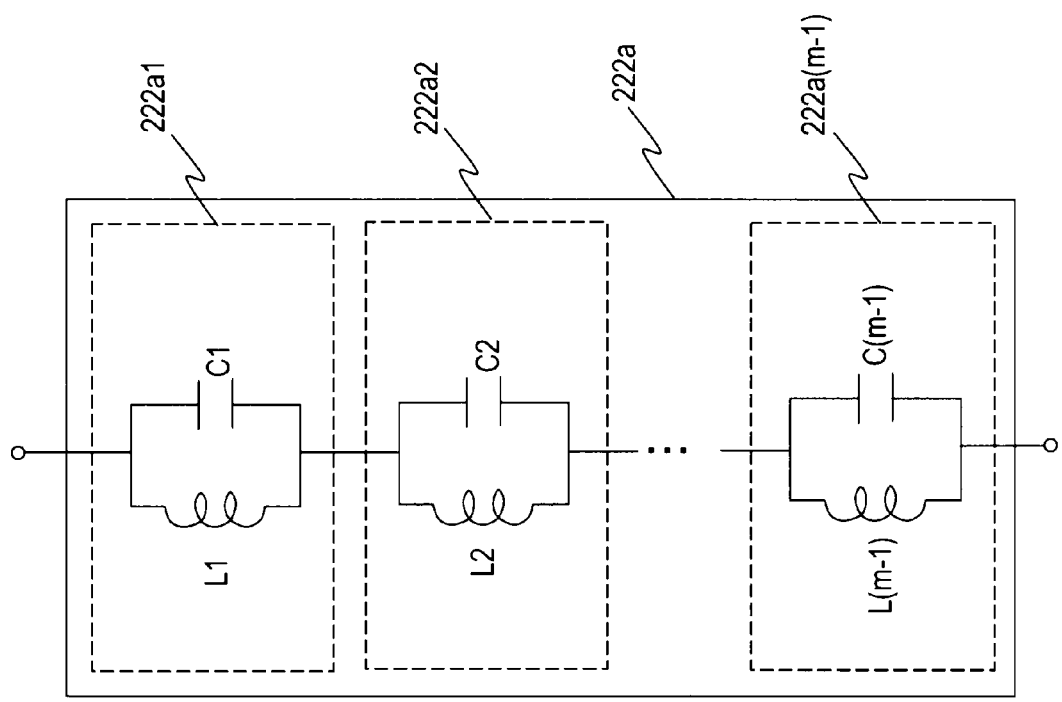
FIG. 10 is a view illustrating a first parallel block formed of (m−1) LC resonance circuits.

The first parallel block 222a is designed to open in impedance the connection point to the signal path in all of the frequency bands $b_1$ to $b_{m-1}$ (the impedance viewed from the connection point to the parallel matching section 222 is infinite or is so large that matching in all the frequency bands $b_1$ to $b_{m-1}$ is not affected). This open state in impedance allows the parallel matching section to be added or isolated in accordance with the frequency in an equivalent manner, without using a switching element to connect or disconnect the parallel matching section. If the first parallel block 222a is a parallel resonance circuit of a capacitor and an inductor, for example, the open state in impedance in all of the frequency bands $b_1$ to $b_{m-1}$ can be created by setting the resonance frequency to a value greater than or equal to $f_{m-1}$ and smaller than or equal to $f_1$. If these frequencies are widely separated, the resonance frequency of the parallel resonance circuit of a capacitor and an inductor may be the average frequency of the central frequencies. The open state in impedance in the frequency bands can be implemented also by a series connection of parallel resonance circuits 222a1, 222a2, ..., and 222a(m−1) of a capacitor and an inductor, whose resonance frequencies correspond to the central frequencies, as shown in FIG. 10. When a variable device is used at least for one of the parallel resonance circuits 222a1, 222a2, ..., and 222a(m−1), the number of the parallel resonance circuits is reduced.

The positions of the first parallel block 222a and the second parallel block 222b can be exchanged. With the exchanged positions, however, an open portion in impedance occurs at the connection point between the two blocks, so that the second parallel block 222b connected to the signal path could affect the impedance matching state in $b_1$ to $b_{m-1}$. The influence can be reduced by providing a lumped constant element as the second parallel block 222b. Then, the connection point to the signal path can be brought to an open state in impedance, and it can be considered that the parallel matching section 222 is isolated from the signal path. When the first parallel block 122a is on the ground side, an open state in impedance can be created also by using a transmission line having a length equal to a quarter of the wavelength at $f_1$ as the first parallel block 122a and using a transmission line having a length greater than or equal to a quarter of the wavelength at $f_1$ and smaller than or equal to a quarter of the wavelength at $f_{m-1}$ as the first parallel block 222a. If these two frequencies are widely separated, the length can be a quarter of the wavelength at the average frequency of the central frequencies.

In this structure, by specifying the series matching section 221 and the parallel matching section 222 appropriately, the m-th matching unit can convert any value of $Z(f_m)$ at point B to Z0 at point C.

By establishing impedance matching in $b_m$ by the m-th matching unit until m=N, an impedance viewed from P1 to P2 can be matched with Z0 in each of the frequency bands.

Since the parallel matching section 222 involved in signal matching only in $b_m$ can be connected and isolated automatically in accordance with the frequency band of the input signal, without using a physical switch, a low-loss multiband matching circuit without the on-resistance loss of the switch can be implemented, and the circuit allows matching to be established simultaneously even if signals of N frequency bands are input simultaneously.

The structure of the matching circuit 200 and the other items concerning the principle of matching are the same as those of the matching circuit 100, and a description thereof will be omitted here.

Third Embodiment

Figure 26:
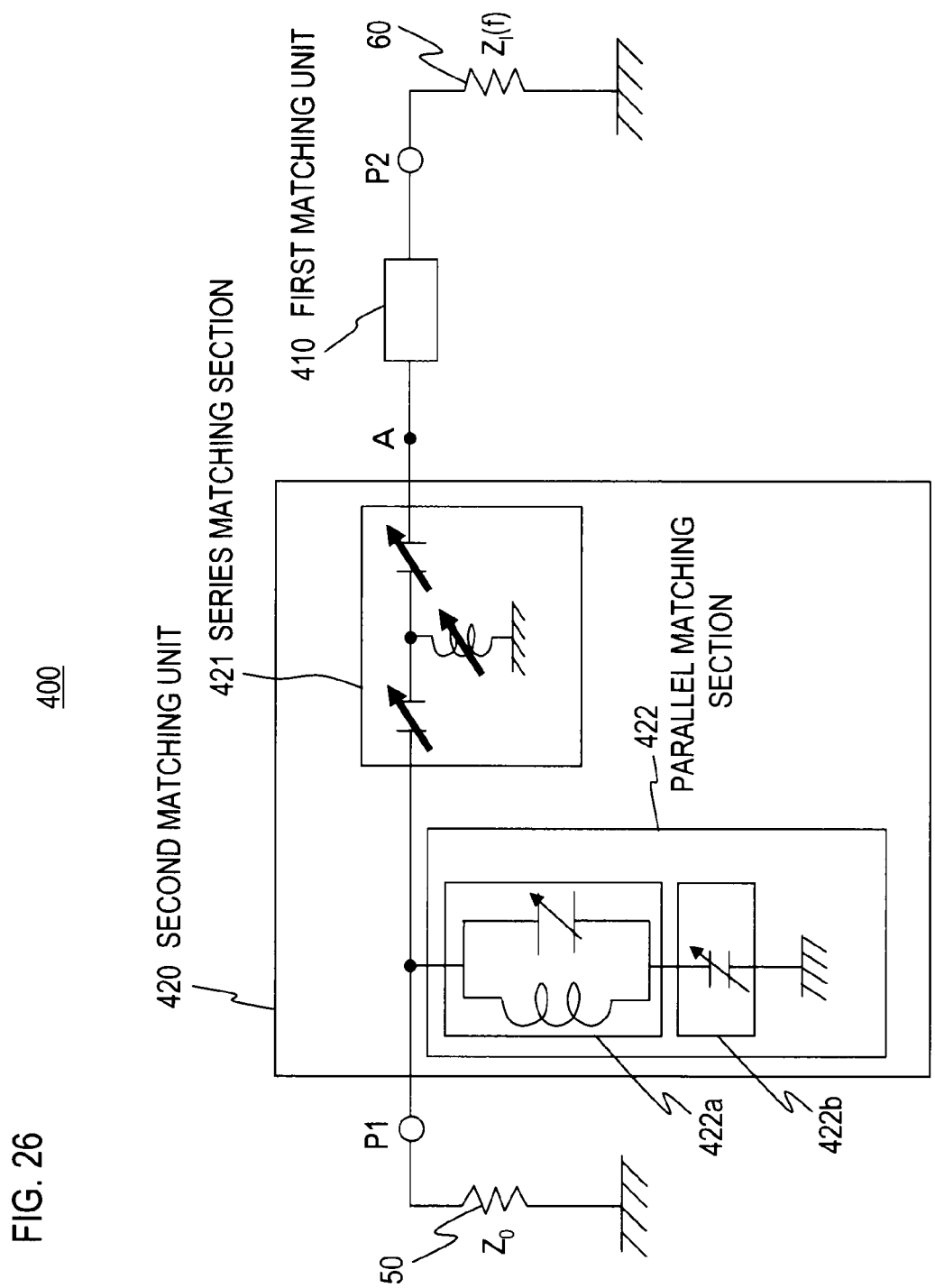
FIG. 26 is a functional block diagram of a multiband matching circuit according to a third embodiment.

FIG. 26 shows the structure of a multiband matching circuit 400 according to a third embodiment. The multiband matching circuit 400 includes a first matching unit 410 and a second matching unit 420. The second matching unit 420 includes a series matching section 421 and a parallel matching section 422. The parallel matching section 422 includes a first parallel block 422a and a second parallel block 422b. In other words, the basic structure is the same as that of the multiband matching circuit 100. The difference is that the first matching unit 410 of the multiband matching circuit 400 can handle $b_1$ to $b_m$. In addition, a variable circuit shown in FIG. 21B is, for example, used as the series matching section 421 of the second matching unit 420; a variable device (such as a parallel resonance circuit formed of an inductor and a variable capacitor) is used as the first parallel block 422a; and a variable device (such as a variable capacitor) is used as the second parallel block 422b. With this structure, matching can also be established in $b_{m+1}$ to $b_N$ frequency bands. Further, the variable device in the first parallel block 422a can be adjusted to set the resonance frequency between $f_1$ and $f_m$. Therefore, matching can be established simultaneously in any set of one of frequency bands between $b_1$ and $b_n$, and one of frequency bands between $b_{m+1}$ and $b_N$. As the series matching section 421, a variable circuit shown in FIG. 20A, 20B, 20C, 21A, 21B, 21C, 22A, or 22B can be used. As the second parallel block 422b, a variable inductor, or a circuit shown in FIG. 22A or 22B, which is equivalent to the variable inductor, can be used in addition to a variable capacitor.

Fourth Embodiment

Figure 11:
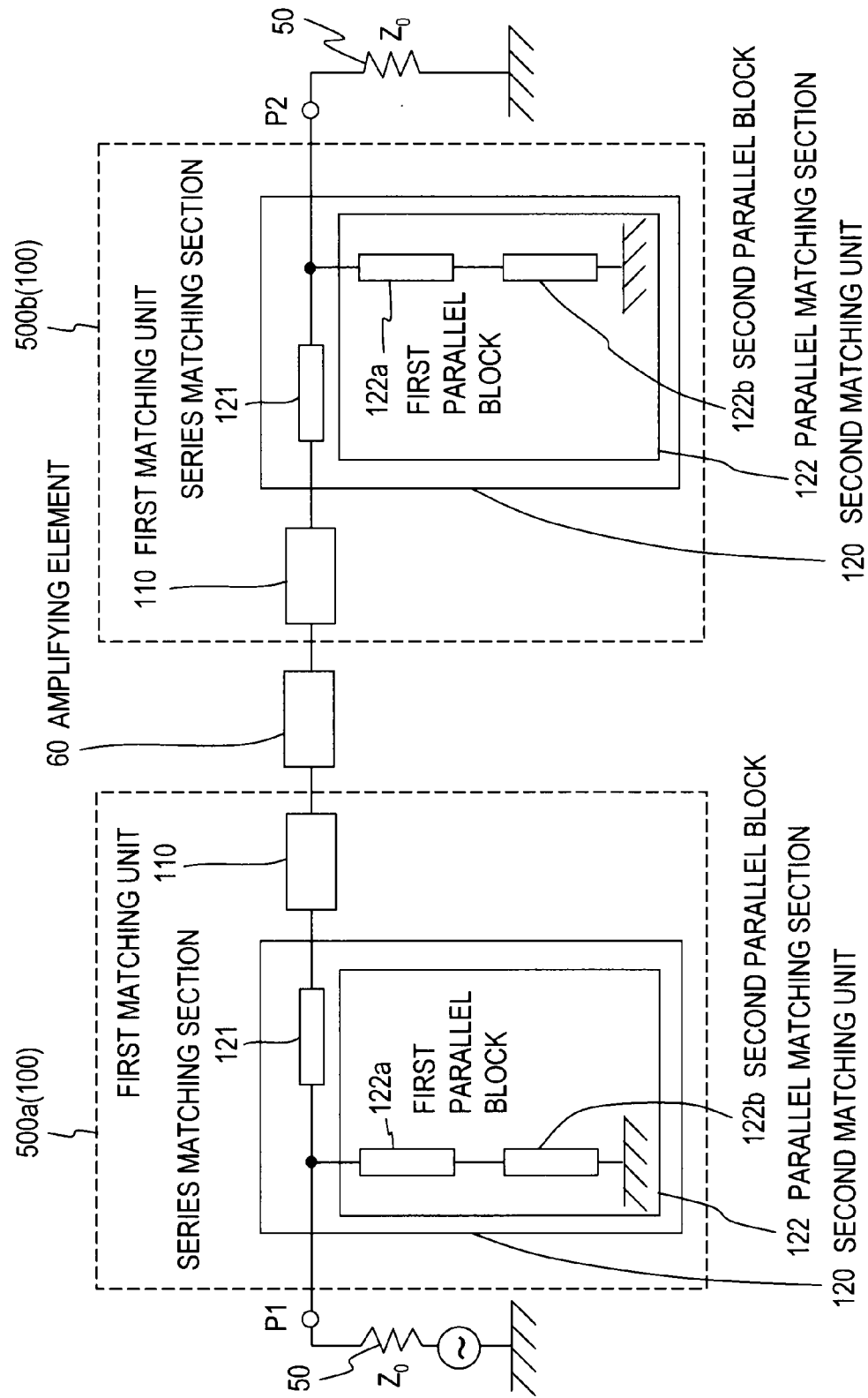
FIG. 11 is a functional block diagram of a multiband power amplifier according to a fourth embodiment.

A multiband amplifier can be configured by using any of the matching circuits described in the first to third embodiments. FIG. 11 shows the structure of a multiband amplifier 500 in which an amplification device 60 is placed between an input matching circuit 500a and an output matching circuit 500b. In the multiband amplifier 500 dealing with two frequency bands, as shown in FIG. 11, the matching circuit 100 is used as both the matching circuits 500a and 500b. A multiband amplifier using the matching circuit 200 as the matching circuits 500a and 500b can deal with N frequency bands.

The type of the amplification device 60 is not restricted. A field effect transistor (FET), a heterojunction bipolar transistor (HBT), or the like can be used, for example.

Effects Checked by Computer Simulation

Figure 12:
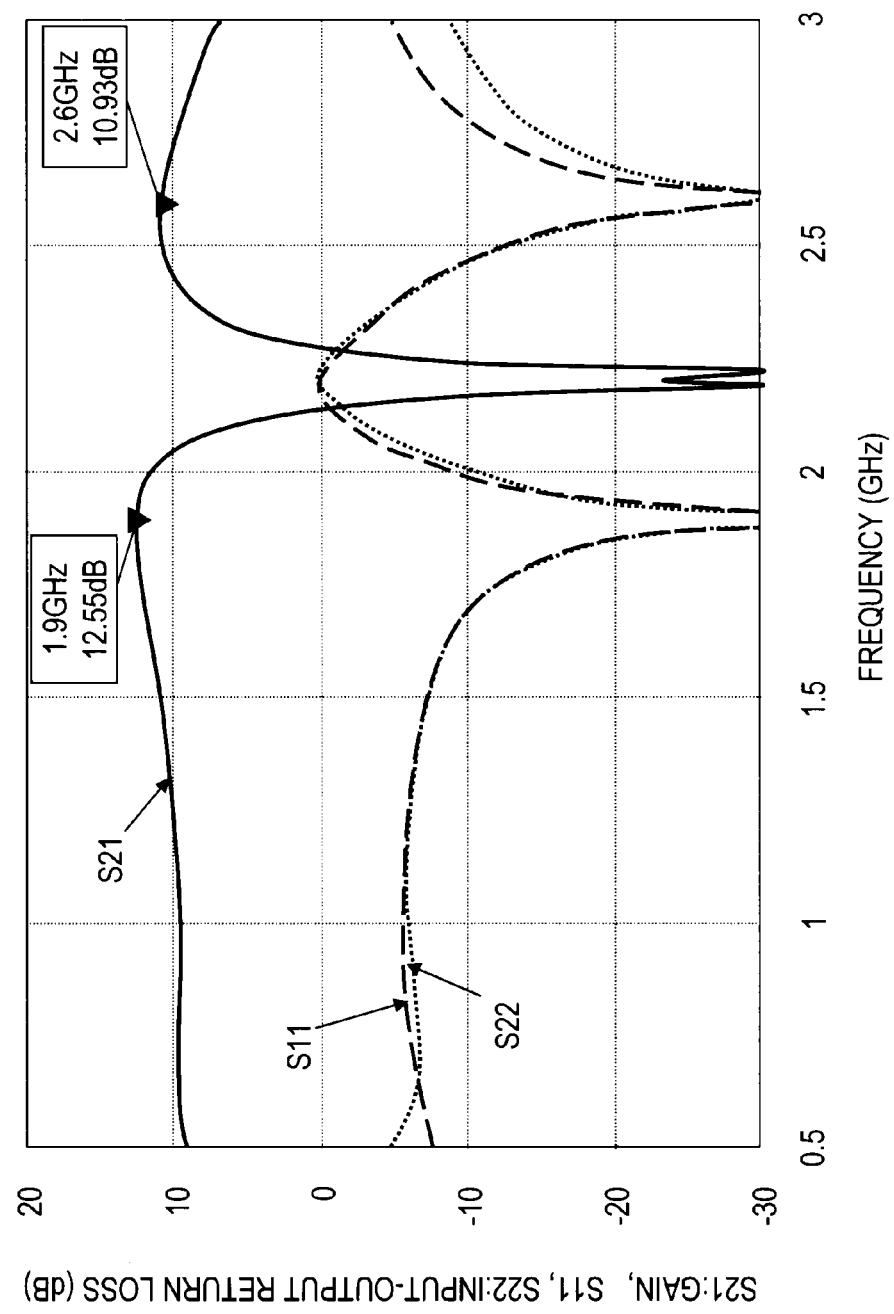
FIG. 12 shows a return loss versus frequency characteristic curve and a gain versus frequency characteristic curve of the multiband power amplifier according to the fourth embodiment.
Figure 13:
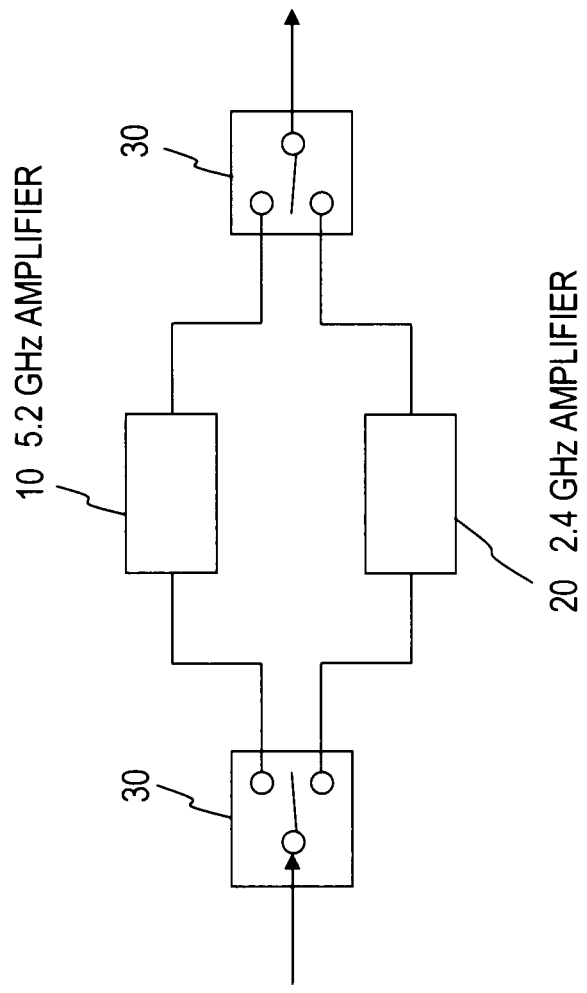
FIG. 13 is a functional block diagram of a conventional multiband amplifier.
Figure 14:
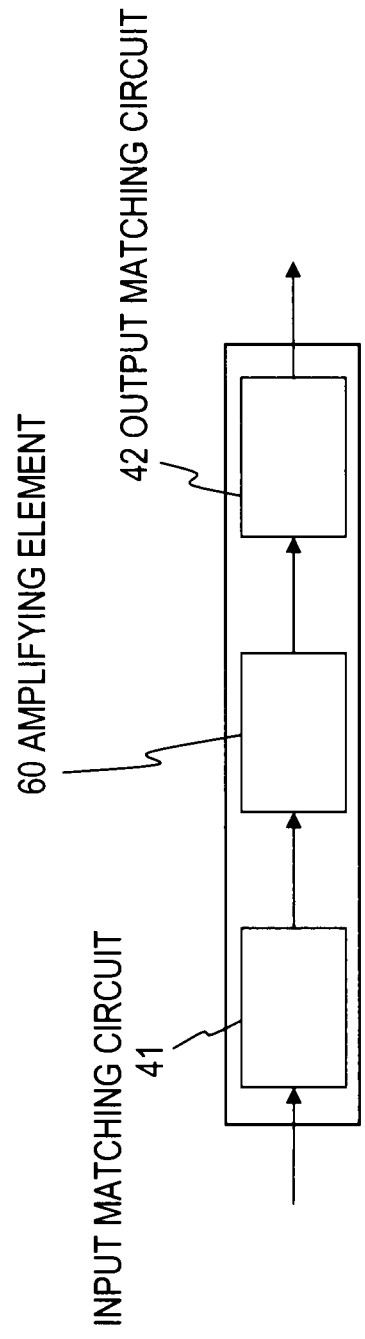
FIG. 14 is a functional block diagram of a conventional amplifier for each frequency band.

FIG. 12 shows the characteristics of the multiband amplifier 500 shown in FIG. 11, where an FET is used as the amplification device 60, and the matching circuits 500a and 500b are configured with $f_1$ and $f_2$ set to 2.6 GHz and 1.9 GHz respectively. In FIG. 12, solid lines represent the gain versus frequency characteristics, and dashed lines represent the return loss versus frequency characteristics at an input port P1 and an output port P2.

The first matching unit 110 is formed of a transmission line and matches the impedance $Z_1(f_1)$ of the amplification device 60 with impedance Z0 in $b_1$. Used as the first series matching section 121 is a transmission line having an impedance of 50Ω, which equals the matching impedance, in $b_1$, so that matching in $b_1$ will not be affected. A capacitor is used as the first parallel block. Used as the second parallel block is a parallel resonance circuit of an inductor and a capacitor, with the resonance frequency agreeing with $f_1$ (2.6 GHz).

As indicated by the dashed lines in FIG. 12, the return is low, and matching is established at design frequencies of 2.6 GHz and 1.9 GHz. The solid lines in FIG. 12 indicate also that sufficient gain is provided at each matching frequency.

What is claimed is:

1. A multiband matching circuit for matching an impedance $Z_1(f)$ of a circuit element having frequency characteristics with a predetermined impedance Z0 of a system circuit in first and second frequency bands when the multiband matching circuit is disposed in a signal path between the circuit element having the impedance $Z_1(f)$ and the system circuit having the impedance Z0, the multiband matching circuit comprising:

a first matching unit connected at one end to the circuit element and adapted to convert the impedance of the circuit element to Z0 in the first frequency band; and a second matching unit which comprises:

a series matching section connected at one end to the other end of the first matching unit and connected at the other end to the system circuit, which is a transmission line whose characteristic impedance is equal to the impedance Z0 of the system circuit or a circuit equivalent to the transmission line at least in the first frequency band; and a parallel matching section connected at one end to the signal path at the other end of the series matching section and grounded at the other end;

the parallel matching section being configured to open in impedance the connection point to the signal path in the first frequency band; and the series matching section and the parallel matching section being designed to match the impedance of the circuit element with Z0 in the second frequency band, wherein the parallel matching section comprises a first parallel block connected at one end to the signal path and a second parallel block connected at one end to the other end of the first parallel block and grounded at the other end, and the first parallel block is configured to open in impedance at the connection point to the signal path in the first frequency band.

2. The multiband matching circuit according to claim 1, wherein the first parallel block is a parallel resonance circuit of a capacitor and an inductor, with the resonance frequency being equal to a central frequency $f_1$ of the first frequency band.

3. A multiband power amplifier comprising an amplification device and a multiband matching circuit according to claim 1 capable of simultaneously amplifying signals in a plurality of frequency bands.

4. A multiband matching circuit for matching an impedance $Z_1(f)$ of a circuit element having frequency characteristics with a predetermined impedance Z0 of a system circuit in first and second frequency bands when the multiband matching circuit is disposed in a signal path between the circuit element having the impedance $Z_1(f)$ and the system circuit having the impedance Z0, the multiband matching circuit comprising:

a first matching unit connected at one end to the circuit element and adapted to convert the impedance of the circuit element to Z0 in the first frequency band; and a second matching unit which comprises:
  a series matching section connected at one end to the other end of the first matching unit and connected at the other end to the system circuit, which is a transmission line whose characteristic impedance is equal to the impedance Z0 of the system circuit or a circuit equivalent to the transmission line at least in the first frequency band; and
  a parallel matching section connected at one end to the signal path at the other end of the series matching section and grounded at the other end;
  the parallel matching section being configured to open in impedance the connection point to the signal path in the first frequency band; and
  the series matching section and the parallel matching section being designed to match the impedance of the circuit element with Z0 in the second frequency band, wherein the parallel matching section comprises a second parallel block connected at one end to the signal path and a first parallel block connected at one end to the other end of the second parallel block and grounded at the other end,
  the second parallel block is formed of a lumped constant element, and
  the first parallel block is configured to open in impedance at the connection point to the second parallel block in the first frequency band.

5. The multiband matching circuit according to claim 4, wherein the first parallel block is a transmission line having a length equal to a quarter of the wavelength at a central frequency $f_1$ of the first frequency band.

6. A multiband matching circuit for matching an impedance $Z_1(f)$ of a circuit element having frequency characteristics with a predetermined impedance Z0 of a system circuit in first to N-th frequency bands (N≧3, central frequencies $f_1 > f_2 > \ldots > f_N$) when the multiband matching circuit is disposed in a signal path between the circuit element having the impedance $Z_1(f)$ and the system circuit having the predetermined impedance Z0, the multiband matching circuit comprising:

a first matching unit connected at one end to the circuit element and adapted to convert the impedance of the circuit element to Z0 in the first frequency band; and m-th matching units (m=2, 3, . . . , and N) each comprising:
  a series matching section connected at one end to the other end of the (m−1)-th matching unit, which is a transmission line whose characteristic impedance is equal to the impedance Z0 of the system circuit or a circuit equivalent to the transmission line at least in each of the first to (m−1)-th frequency bands; and
  a parallel matching section connected at one end to the signal path at the other end of the series matching section and grounded at the other end;
the other end of the series matching section of the N-th matching unit being connected to the system circuit;
the parallel matching section of the m-th matching unit being configured to open in impedance at the connection point to the signal path in the first to (m−1)-th frequency bands; and
the series matching section and the parallel matching section of the m-th matching unit being designed to match the impedance of the circuit element with Z0 in the m-th frequency band,
wherein the parallel matching section of the m-th matching unit comprises a first parallel block connected at one end to the signal path and a second parallel block connected at one end to the other end of the first parallel block and grounded at the other end, and
the first parallel block is configured to open in impedance at the connection point to the signal path in each of the first to (m−1)-th frequency bands.

7. The multiband matching circuit according to claim 6, wherein the first parallel block is a parallel resonance circuit of a capacitor and an inductor, with the resonance frequency being greater than or equal to the central frequency $f_{m-1}$ of the (m−1)-th frequency band and smaller than or equal to the central frequency $f_1$ of the first frequency band.

8. The multiband matching circuit according to claim 6, wherein the first parallel block is a series connection of m−1 parallel circuits of capacitors and inductors, with the resonance frequencies being the central frequencies $f_1, f_2, \ldots,$ and $f_{m-1}$ of the first to (m−1)-th frequency bands, respectively.

9. A multiband matching circuit for matching an impedance $Z_1(f)$ of a circuit element having frequency characteristics with a predetermined impedance Z0 of a system circuit in first to N-th frequency bands (N≧3, central frequencies $f_1 > f_2 > \ldots > f_N$) when the multiband matching circuit is disposed in a signal path between the circuit element having the impedance $Z_1(f)$ and the system circuit having the predetermined impedance Z0, the multiband matching circuit comprising:

a first matching unit connected at one end to the circuit element and adapted to convert the impedance of the circuit element to Z0 in the first frequency band; and m-th matching units (m=2, 3, ..., and N) each comprising:
  a series matching section connected at one end to the other end of the (m−1)-th matching unit, which is a transmission line whose characteristic impedance is equal to the impedance Z0 of the system circuit or a circuit equivalent to the transmission line at least in each of the first to (m−1)-th frequency bands; and
  a parallel matching section connected at one end to the signal path at the other end of the series matching section and grounded at the other end;
the other end of the series matching section of the N-th matching unit being connected to the system circuit;
the parallel matching section of the m-th matching unit being configured to open in impedance at the connection point to the signal path in the first to (m−1)-th frequency bands; and
the series matching section and the parallel matching section of the m-th matching unit being designed to match the impedance of the circuit element with Z0 in the m-th frequency band,
wherein the parallel matching section of the m-th matching unit comprises a second parallel block connected at one end to the signal path and a first parallel block connected at one end to the other end of the second parallel block and grounded at the other end,
the second parallel block is formed of a lumped constant element, and
the first parallel block is configured to open in impedance at the connection point to the second parallel block in each of the first to (m−1)-th frequency bands.

10. The multiband matching circuit according to claim 9, wherein the first parallel block is a transmission line whose length is greater than or equal to a quarter of the wavelength at the central frequency $f_1$ of the first frequency band and smaller than or equal to a quarter of the wavelength at the central frequency $f_{m-1}$ of the (m−1)-th frequency band.

11. A multiband matching circuit for matching an impedance $Z_1(f)$ of a circuit element having frequency characteristics with a predetermined impedance Z0 of a system circuit in two frequency bands of first to N-th frequency bands (N≧3) when the multiband matching circuit is disposed in a signal path between the circuit element having the impedance $Z_1(f)$ and the system circuit having the impedance Z0, the multiband matching circuit comprising:
  a first matching unit connected at one end to the circuit element and adapted to convert the impedance of the circuit element to Z0 in one of the first to m-th (m≧2) frequency bands; and
  a second matching unit which comprises:
    a series matching section connected at one end to the other end of the first matching unit and connected at the other end to the system circuit, which is a transmission line whose characteristic impedance is equal to the impedance Z0 of the system circuit or a circuit equivalent to the transmission line at least in the one of the first to m-th frequency bands; and
    a parallel matching section connected at one end to the signal path at the other end of the series matching section and grounded at the other end;
  the parallel matching section being configured to open in impedance at the connection point to the signal path in the one of the first to m-th frequency bands; and
  the series matching section and the parallel matching section being designed to match the impedance of the circuit element with Z0 in one of (m+1)-th to N-th frequency bands,
  wherein the parallel matching section comprises a first parallel block, which is a variable device, connected at one end to the signal path, and a second parallel block, which is a variable device, connected at one end to the other end of the first parallel block and grounded at the other end, and
  the first parallel block is configured to open in impedance at the connection point to the signal path in the one of the first to m-th frequency bands.

12. The multiband matching circuit according to claim 11, wherein the first parallel block is a parallel resonance circuit of a variable capacitor and an inductor.

* * * * *